US006930922B2

(12) United States Patent
Mori et al.

(10) Patent No.: US 6,930,922 B2
(45) Date of Patent: Aug. 16, 2005

(54) READING CIRCUIT, REFERENCE CIRCUIT, AND SEMICONDUCTOR MEMORY DEVICE

(75) Inventors: Yasumichi Mori, Nara (JP); Takahiko Yoshimoto, Yamatotakada (JP); Shinsuke Anzai, Tenri (JP); Takeshi Nojima, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 198 days.

(21) Appl. No.: 10/630,568

(22) Filed: Jul. 29, 2003

(65) Prior Publication Data

US 2004/0047207 A1 Mar. 11, 2004

(30) Foreign Application Priority Data

Jul. 30, 2002 (JP) ........................................ 2002-221311

(51) Int. Cl.[7] .............................................. G11C 16/06
(52) U.S. Cl. .................. 365/185.21; 365/207; 365/208; 365/185.03; 365/185.2
(58) Field of Search ................................ 365/205, 207, 365/208, 210, 185.03, 185.2, 185.21

(56) References Cited

U.S. PATENT DOCUMENTS 6,118,701 A * 9/2000 Uekubo .................... 365/185.2
6,233,189 B1 * 5/2001 Tanzawa et al. ............ 365/207
6,301,149 B1 * 10/2001 Micheloni et al. .......... 365/168
6,445,616 B2 * 9/2002 Kim ........................ 365/185.2

* cited by examiner

Primary Examiner—Son Mai
(74) Attorney, Agent, or Firm—Morrison & Foerster LLP

(57) ABSTRACT

A reading circuit, for reading data from one memory cell of a plurality of memory cells, includes a plurality of division sensing circuits each connected to the one memory cell via a sensing line corresponding thereto among a plurality of sensing lines; and a current-voltage conversion circuit for converting a current flowing through each sensing line into a sensing voltage representing a potential of the corresponding sensing line. Each division sensing circuit includes a current load circuit for supplying a current to the one memory cell via a corresponding sensing line, and a sense amplifier for sensing a potential difference between the corresponding sensing line and a corresponding reference line of a plurality of reference lines. The current load circuit included in at least one division sensing circuit has a current supply capability different from that of the current load circuit included in another division sensing circuits.

27 Claims, 18 Drawing Sheets

Source-drain current of NMOS transistor

FIG.13

| Input | | | Output | |
|---|---|---|---|---|
| H5 output | H6 output | H7 output | H14 | H15 |
| 0 | 0 | 0 | 0 | 0 |
| 1 | 0 | 0 | 0 | 1 |
| 1 | 1 | 0 | 1 | 0 |
| 1 | 1 | 1 | 1 | 1 |

READING CIRCUIT, REFERENCE CIRCUIT, AND SEMICONDUCTOR MEMORY DEVICE

BACKGROUND OF THE INVENTION

1. Field of the Invention

The present invention relates to a reading circuit, a reference circuit, and a semiconductor memory device including such a reading circuit and such a reference circuit.

2. Description of the Related Art

In general, a reading circuit for reading data from a memory cell array including a plurality of memory cells supplies an electric current to a memory cell having data stored therein, and compares the current (cell current) flowing through the memory cell with a reference current so as to determine whether the level of the cell current is higher or lower than the level of the reference current. Thus, the data written in the memory cell is read. Such a system of reading data is referred to as a "current sensing system".

For example, data is read from so-called two-level memory cells which can store 1-bit data in one memory cell as described below with reference to FIG. 9B. A first state in which the level of the cell current is higher than that of the reference current (corresponding to data "1"), and a second state in which the level of the cell current is lower than that of the reference current (corresponding to data "0"), are preset. The reference current level is set to an intermediate level between the first state and the second state. Then, the cell current level in the memory cell is compared with the reference current level, and thus the 1-bit data stored in the memory cell can be read. In actuality, the cell current and the reference current are subjected to current-voltage conversion, and the potential of a sensing line through which the cell current flows is compared with the potential of a reference line through which the reference current flows.

In addition to such two-level memory cells, multi-level memory cells have recently been studied which can store data of 2-bits or more in one memory cell, in order to increase the storage capacity and/or reduce the production cost of semiconductor chips.

In this specification, the term "multi-level memory cells" means tertiary or higher memory cells, i.e., memory cells which can store 1.5-bit data or more in one memory cell.

For example, data is read from quaternary memory cells which can store 2-bit data in one memory cell as described below with reference to FIG. 9A. Four states which the cell current can be in are preset. More specifically, a first state, a second state, a third state, and a fourth state are set in order of the cell current level. The cell current level is highest in the first state and lowest in the fourth state. In this example, the first state corresponds to data "11", the second state corresponds to data "10", the third state corresponds to data "01", and the fourth state corresponds to data "00".

Then, three reference current levels are set so as to be between the four states of the cell current. More specifically, a first reference current level L is set at an intermediate level between the first state (corresponding to data "11") and the second state (corresponding to data "10"), a second reference current level M is set at an intermediate level between the second state (corresponding to data "10") and the third state (corresponding to data "01"), and a third reference current level H is set at an intermediate level between the third state (corresponding to data "01") and the fourth state (corresponding to data "00").

The reference current levels set in this manner are compared with the cell current level in the memory cell, and thus the 2-bit data can be read in accordance with the cell current level.

In order to read from general multi-level memory cells which can store n-bit data in one memory cell, it is necessary to preset $2^n$ states which the cell current can be in and also set $2^n-1$ reference current levels.

As can be appreciated from FIGS. 9A and 9B, in general, it is physically more difficult for a multi-level memory cell than a two-level memory cell to obtain a sufficient current level difference between the cell current levels and the reference current levels. In such a case where the current level difference between the cell current levels and the reference current levels is relatively small, it is not easy to obtain a sufficiently large operation margin, especially in a reading circuit.

In a multi-level memory cell, it is necessary to compare the cell current level with many types of reference current levels in order to read data stored in a memory cell. For example, in order to read 2-bit data, the cell current level in the memory cell needs to be compared with three reference current levels. This undesirably extends the read time.

In order to solve these problems, a plurality of systems have been proposed for reading data from a multi-level memory cell. One such system is a time division sensing system, by which the cell current level in the memory cell is compared with one reference current level at a time, and in accordance with the comparison result, the cell current level is compared with another reference current level. Thus, the current levels are compared sequentially in a time division manner. Another system is a parallel sensing system, by which the cell current level is compared with a plurality of reference current levels at a time.

As an example of the time division sensing system, an operation of reading data from multi-level memory cells which can store 2-bit data in one memory cell (FIG. 9A) will be described with reference to FIG. 10.

FIG. 10 is a circuit diagram of a conventional reading circuit J100 for reading data from memory cells in the time division sensing system.

In FIG. 10, the reading circuit J100 reads data from only one memory cell. This is merely exemplary, and the reading circuit J100 may read data from one selected memory cell among a plurality of memory cells.

The reading circuit J100 includes a current load circuit J1 for applying a voltage to a drain of a selected cell J7 from which data is to be read, so as to obtain a reading current (cell current), and a current load circuit J2 for obtaining a reference current.

A sensing line J9 is provided for connecting the drain of the selected cell J7 to the current load circuit J1, and a reference line J10 is provided for connecting the current load circuit J2 to a selection circuit J6. The selection circuit J6 connects one of resources J80 through J82 of the reference current to the current load circuit J2.

The sensing line J9 and the reference line J10 are respectively connected to input sections of a sense amplifier J3. The sense amplifier J3 senses the potential difference between the potential of the sensing line J9 and the potential of the reference line J10 and amplifies the potential difference.

An output section of the sense amplifier J3 is connected to a first data latch circuit J4 for latching an output from the sense amplifier J3 during a first sensing period and to a second data latch circuit J5 for latching an output from the sense amplifier J3 during a second sensing period, which is after the first sensing period.

The first data latch circuit J4 is connected to the selection circuit J6 via a line J111. The selection circuit J6 selects one of the resources J80 through J82 of the reference current in accordance with the output from the first data latch circuit J4, and connects the selected resource to the reference line J10.

The reading circuit J100 of the time division sensing system having the above-described structure reads data from the selected cell J7 in the following manner. In the following description, the selection circuit J6 connects the reference line J10 to the resource J80 in an initial state.

First, an appropriate voltage is applied to a gate and a drain of the selected cell J7, thereby generating a cell current flowing through the selected cell J7. Next, the potential of the sensing line J9 is dropped in accordance with the generated cell current.

Similarly, a reference current is generated flowing from the resource J80 selected by the selection circuit J6. In accordance with the reference current, the potential of the reference line J10 is dropped.

Then, the potential difference between the potential of the sensing line J9 and the potential of the reference line J10 is sensed and amplified by the sense amplifier J3. When the level of the cell current is lower than the level of the reference current, the sense amplifier J3 outputs "0". When the level of the cell current is higher than the level of the reference current, the sense amplifier J3 outputs "1".

The output from the sense amplifier J3 in the first sensing period is latched by the first data latch circuit J4.

The resource J80 of the reference current selected by the selection circuit J6 during the first sensing period is for obtaining a reference current level "M" which is between the second state (FIG. 9A) (corresponding to data "10") and the third state (corresponding to data "01") among the three reference current levels.

In general, as the resources J80 through J82, reference cells having the same structure and the same characteristics as those of the memory cell, whose threshold voltages are tightly adjusted, are used in order to obtain appropriate reference currents.

Next, based on the output from the sense amplifier J3 during the first sensing period, the output being latched by the first data latch circuit J4, the selection circuit J6 switches the resource of the reference current from J80 to J81 or J82.

When the first data latch circuit J4 latches data "0" (i.e., when the cell current level is lower than the reference current level), the resource of the reference current is switched to J81. When the first data latch circuit J4 latches data "1" (i.e., when the cell current level is higher than the reference current level), the resource of the reference current is switched to J82.

The resource J81 is for obtaining a reference current level "H" which is between the third state (FIG. 9A) (corresponding to data "01") and the fourth state (corresponding to data "00") among the three reference current levels. The resource J82 is for obtaining a reference current level "L" which is between the first state (FIG. 9A) (corresponding to data "11") and the second state (corresponding to data "10").

Then, in the second sensing period, the sensing operation is performed in substantially the same manner as in the first sensing period, and the second data latch circuit J5 latches the output from the sense amplifier J3 in the second sensing period.

In this manner, the 2-bit data stored in the selected cell J7 can be read.

The above description is regarding quaternary memory cells which can store 2-bit data in one memory cell. The time division sensing system can also be used for memory cells which can store n-bit data in one memory cell. In this case, the n-bit data can be read by performing the sensing operation as few as n times.

With the time division sensing system, a plurality of bits of data can be read using as few as one sense amplifier. Therefore, the area of the chip occupied by the sense amplifier, the level of current instantaneously consumed, and the like can be minimized. Since the circuit constants of the current load circuits J1 and J2 and other parameters are switched, a larger operation margin can be easily obtained for each cycle of sensing operation.

However, the time division sensing system requires a setup/hold time for latching the output from the sense amplifier J3 by the data latch circuits J4 and J5 for each cycle of sensing operation, and also requires a switching time between the sensing periods. Therefore, data read cannot be easily performed at high speed.

Next, the parallel sensing system by which the cell current level is compared with a plurality of reference current levels at a time will be described.

As an example of the parallel sensing system, an operation of reading data from multi-level memory cells which can store 2-bit data in one memory cell (FIG. 9A) will be described with reference to FIG. 11.

FIG. 11 is a circuit diagram of a conventional reading circuit H100 for reading data from memory cells in the parallel sensing system.

In FIG. 11, the reading circuit H100 reads data from only one memory cell. This is merely exemplary, and the reading circuit H100 may read data from one selected memory cell among a plurality of memory cells.

The reading circuit H100 includes a current load circuit H1 for applying a voltage to a drain of a selected cell H8 from which data is to be read, so as to obtain a reading current (cell current), and current load circuits H2 through H4 for applying voltages to the resources H80 through H82 of the reference current so as to obtain reference current levels respectively. The current load circuits H1 through H4 have the same characteristics.

A sensing line H9 is provided for connecting the drain of the selected cell H8 to the current load circuit H1, and a reference line H10 is provided for connecting the resource H80 to the current load circuit H2. A reference line H11 is provided for connecting the resource H81 to the current load circuit H3, and a reference line H12 is provided for connecting the resource H82 to the current load circuit H4.

The sensing line H9 and the reference line H10 are respectively connected to input sections of a sense amplifier H5. The sense amplifier H5 senses the potential difference between the potential of the sensing line H9 and the potential of the reference line H10 and amplifies the potential difference.

The sensing line H9 and the reference line H11 are respectively connected to input sections of a sense amplifier H6. The sense amplifier H6 senses the potential difference between the potential of the sensing line H9 and the potential of the reference line H11 and amplifies the potential difference.

The sensing line H9 and the reference line H12 are respectively connected to input sections of a sense amplifier H7. The sense amplifier H7 senses the potential difference between the potential of the sensing line H9 and the potential of the reference line H12 and amplifies the potential difference.

A logic circuit H13 is connected to an output section of each of the sense amplifiers H5 through H7, and 2-bit data is read from an output section of the logic circuit H13 via lines H14 and H15.

The reading circuit H100 of the parallel sensing system having the above-described structure reads data from the selected cell H8 in the following manner.

First, an appropriate voltage is applied to a gate and a drain of the selected cell H8, thereby generating a cell current flowing through the selected cell H8. Next, the potential of the sensing line H9 is dropped in accordance with the generated cell current.

Similarly, a reference current is generated flowing from the resource H80. In accordance with the reference current, the potential of the reference line H10 is dropped. When a reference current is generated flowing from the resource H81, the potential of the reference line H11 is dropped in accordance with the generated reference current. When a reference current is generated flowing from the resource H82, the potential of the reference line H12 is dropped in accordance with the generated reference current.

The resource H80 of the reference current is for obtaining a reference current level "H" which is between the third state (FIG. 9A) (corresponding to data "01") and the fourth state (corresponding to data "00") among the three reference current levels. The resource H81 of the reference current is for obtaining a reference current level "M" which is between the second state (FIG. 9A) (corresponding to data "10") and the third state (corresponding to data "01"). The resource H82 of the reference current is for obtaining a reference current level "L" which is between the first state (FIG. 9A) (corresponding to data "11") and the second state (corresponding to data "10").

In general, as the resources H80 through H82, reference cells having the same structure and the same characteristics as those of the memory cell, whose threshold voltages are tightly adjusted, are used in order to obtain appropriate reference currents.

The potential difference between the potential of the sensing line H9 and the potential of each of the reference lines H10 through H12 is sensed in parallel and amplified by each of the sense amplifiers H5 through H7. Thus, 3-bit data is output from the sense amplifiers H5 through H7 to the logic circuit H13.

The 3-bit data output from the sense amplifiers H5 through H7 is converted by the logic circuit H13 into 2-bit data, which is the data actually read.

With reference to FIGS. 12 and 13, a specific embodiment of the logic circuit H13 (FIG. 11) will be described.

FIG. 12 shows the relationship between the cell current level which the memory cell can have and the reference current level, and the outputs from the sense amplifiers H5 through H7 (FIG. 11).

As described above, the reference current level from the resource H80 is set to be level "H" between the third state (corresponding to data "01") and the fourth state (corresponding to data "00"). The reference current level from the resource H81 is set to be level "M" between the second state (corresponding to data "10") and the third state (corresponding to data "01"). The reference current level from the resource H82 is set to be level "L" between the first state (corresponding to data "11") and the second state (corresponding to data "10").

In this example, when the cell current level is higher than the reference current level, the sense amplifiers H5 through H7 each output data "1" to the logic circuit H13. When the cell current level is lower than the reference current level, the sense amplifiers H5 through H7 each output data "0" to the logic circuit H13.

As shown in FIG. 12, the output from the sense amplifier H5 is "1" when the cell current level is in one of the first through third states, and is "0" when the cell current level is in the fourth state. The output from the sense amplifier H6 is "1" when the cell current level is in one of the first and second states, and is "0" when the cell current level is one of the third and fourth states. The output from the sense amplifier H7 is "1" when the cell current level is in the first state, and is "0" when the cell current level is one of the second through fourth states.

FIG. 13 shows a truth table for explaining the conversion of the 3-bit input into 2-bit output performed by the logic circuit H13 (FIG. 11). The logic circuit H13 is a 3-bit input/2-bit output logic circuit, which realizes the truth table shown in FIG. 13.

As shown in FIG. 13, when the outputs of the sense amplifiers H5, H6 and H7 are "0", "0" and "0", this means that the cell current level is in the fourth state corresponding to data "00". In this case, the logic circuit H13 outputs "0" via the line H14 and outputs "0" via the line H15.

When the outputs of the sense amplifiers H5, H6 and H7 are "1", "0" and "0", this means that the cell current level is in the third state corresponding to data "01". In this case, the logic circuit H13 outputs "0" via the line H14 and outputs "1" via the line H15.

When the outputs of the sense amplifiers H5, H6 and H7 are "1", "1" and "0", this means that the cell current level is in the second state corresponding to data "10". In this case, the logic circuit H13 outputs "1" via the line H14 and outputs "0" via the line H15.

When the outputs of the sense amplifiers H5, H6 and H7 are "1", "1" and "1", this means that the cell current level is in the first state corresponding to data "11". In this case, the logic circuit H13 outputs "1" via the line H14 and outputs "1" via the line H15.

The reading circuit H100 for reading data from quaternary memory cells which can store 2-bit data in one memory cell includes three sense amplifiers. A reading circuit for reading data from multi-level memory cells which can store n-bit data in one memory cell theoretically needs to include $2^n-1$ sense amplifiers.

With the parallel sensing system, n-bit data can be read in one cycle of sensing operation by allowing a plurality of sense amplifiers (H5 through H7 in the example of FIG. 11) to operate in parallel. Accordingly, the parallel sensing system is very advantageous for increasing the speed of data read.

However, the parallel sensing system, which requires a plurality of sense amplifiers, is disadvantageous in, for example, increasing the area of the chip occupied by sense amplifiers and in increasing the level of current instantaneously consumed.

The current load circuits H1 through H4 have the same characteristics but the sense amplifiers H5 through H7 have different operating points since the sense amplifiers H5 through H7 receive different levels of reference current. Therefore, in the case of the reading circuit H100, it is necessary to obtain a uniform operation margin over a wide range of the cell current levels including the operating points of the sense amplifiers H5 through H7. This makes it difficult to enlarge the absolute operation margin at each of the operating points of the sense amplifiers H5 through H7.

Hereinafter, the operation margin of the reading circuit in the time division sensing system and the parallel sensing system will be described. In the following description, the term "sensing voltage conversion efficiency" is defined as the absolute value of the sensing voltage difference/cell current difference, which is the ratio of the sensing voltage difference with respect to the cell current difference. The sensing voltage difference represents the difference between the sensing voltage and the reference voltage. The cell current difference represents the difference between the cell current level and the reference current level. The sensing voltage represents the potential of the sensing line, and the reference voltage represents the potential of the reference line. As the sensing voltage conversion efficiency is larger, the operation margin of the reading circuit is larger. Even when the cell current difference is the same, a larger sensing voltage difference (i.e., a higher sensing voltage conversion efficiency) leads to a larger operation margin. A larger operation margin is more advantageous for shortening the reading time.

The operation margin and the sensing voltage conversion efficiency will be described by showing the relationship between the cell current and the sensing voltage in accordance with the load characteristics of the current load circuits.

FIG. 14A shows a reading circuit 200 using a resistance as a general current load.

In the reading circuit 200 shown in FIG. 14A, a current load circuit L10 uses a resistance L1 as a current load, and a current load circuit L20 uses a resistance L2 as a current load.

When a cell current flowing through a memory cell L5 is generated, the potential of a sensing line L3 is dropped in accordance with the level of the generated cell current.

Similarly, when a reference current flowing through a reference cell L6 is generated, the potential of a reference line L4 is dropped in accordance with the level of the generated reference current.

FIG. 14B is a graph illustrating the relationship between the cell current and the sensing voltage in the reading circuit 200. In FIG. 14B, the absolute value of the gradient of the curve represents the sensing voltage conversion efficiency.

Since the resistances L1 and L2 are used as the current loads of the current load circuits L10 and L20 of the reading circuit 200, the curve representing the relationship between the sensing voltage and the cell current is linear.

In the reading circuit 200 having a linear load characteristic, the sensing voltage conversion efficiency is uniform (constant) over the entire region of the cell current levels.

In the parallel sensing system, the sensing operation needs to be performed at a plurality of operating points. Therefore, it is preferable to use a reading circuit having a linear load characteristic as shown in FIG. 14B in order to obtain a uniform operation margin at each of the operating points. However, such a reading circuit has a lower sensing voltage conversion efficiency than that of a reading circuit having a nonlinear load characteristic (described below) and thus is not suitable for multi-level memory cells having a smaller difference in the cell current level.

In the case where the number of operating points used in one cycle of sensing operation is limited as in the time division sensing system, a reading circuit having a nonlinear load characteristic, by which the sensing voltage conversion efficiency in the vicinity of the operating point is higher than the rest, can be used.

FIG. 15A shows a reading circuit 300 as an example of a current load circuit having a nonlinear load characteristic. In the reading circuit 300, PMOS transistors are current-mirror-connected to each other.

In the reading circuit 300 shown in FIG. 15A, a current load circuit K10 uses a PMOS transistor K1 as a current load, and a current load circuit K20 uses a PMOS transistor K2 as a current load. A drain and a gate of the PMOS transistor K2 are connected to each other, and a gate of the PMOS transistor K1 is connected to a gate of the PMOS transistor K2 via a reference line K4.

When a cell current flowing through a reference cell K6 is generated, the potential of a reference line K4 is dropped in accordance with the level of the generated reference current. Similarly, when a cell current flowing through a memory cell K5 is generated, the potential of a sensing line K3 is dropped in accordance with the level of the generated cell current.

FIG. 15B is a graph illustrating the relationship between the cell current and the sensing voltage in the reading circuit 300.

Since the PMOS transistors K1 and K2 are used as the current loads of the current load circuits K10 and K20, the curve representing the relationship between the sensing voltage and the cell current is nonlinear.

In the reading circuit 300 having a nonlinear load characteristic, the sensing voltage conversion efficiency (represented by the absolute value of the gradient of the curve in FIG. 15B) can be higher in the vicinity of the point at which the cell current level is equal to the reference current level than that in the reading circuit 200 (FIGS. 14A and 14B). When the sensing voltage conversion efficiency is higher, the reading operation margin can be larger even when the cell current difference is small. Therefore, such a reading circuit is suitable for multi-level memory cells. However, such a reading circuit has a lower sensing voltage conversion efficiency in the region of the cell current levels other than the reference current level, and thus it is not easy to perform the sensing operation at a plurality of operating points.

As described above, when the time division sensing system is used for multi-level memory cells adopting a current sensing system, it is preferable to use a reading circuit having a nonlinear reading load characteristic in order to enlarge the operation margin in the region around the operating point. However, this requires a setup/hold time for latching the output from the sense amplifier for each sensing period, and it is not easy to increase the reading time.

When the parallel sensing system is used, it is necessary to enlarge substantially uniform operation margins at each of a plurality of operating points. Thus, it is difficult to enlarge an absolute operation margin. Accordingly, the parallel sensing system is not suitable for multi-level memory cells.

SUMMARY OF THE INVENTION

According to one aspect of the invention, a reading circuit for reading data from one memory cell of a plurality of memory cells is provided. The reading circuit includes a plurality of division sensing circuits each connected to the one memory cell via a sensing line corresponding thereto among a plurality of sensing lines; and a current-voltage conversion circuit for converting a current flowing through each of the plurality of sensing lines into a sensing voltage representing a potential of each of the plurality of sensing lines. Each of the plurality of division sensing circuits includes a current load circuit for supplying a current to the one memory cell via a corresponding sensing line among the plurality of sensing lines, and a sense amplifier for sensing a potential difference between the potential of the corresponding sensing line and a potential of a corresponding reference line of a plurality of reference lines. The current load circuit included in at least one division sensing circuit of the plurality of division sensing circuits has a current supply capability which is different from the current supply capability of the current load circuit included in another division sensing circuits among the plurality of division sensing circuits.

In one embodiment of the invention, the current-voltage conversion circuit includes a cell current division section for connecting or separating the plurality of sensing lines to or from the one memory cell.

In one embodiment of the invention, the reading circuit further includes a first reference circuit for applying a first type of reference voltage representing a potential of one reference line among the plurality of reference lines to a sense amplifier corresponding to the one reference line among the plurality of sense amplifiers.

In one embodiment of the invention, the current supply capability of each of the plurality of current load circuits is controlled by a first type of reference voltage representing a potential of a reference line corresponding thereto among the plurality of reference lines.

In one embodiment of the invention, each of the plurality of current load circuits includes a PMOS transistor having a gate to which a reference voltage is to be applied via a reference line corresponding thereto among the plurality of reference lines.

In one embodiment of the invention, the reading circuit further includes a second reference circuit for applying a second type of reference voltage for controlling the current supply capability of each of the plurality of current load circuits.

In one embodiment of the invention, each of the plurality of current load circuits includes a PMOS transistor having a gate connected to the second reference circuit.

In one embodiment of the invention, the reading circuit further includes a first reference circuit for applying a first type of reference voltage representing a potential of one reference line among the plurality of reference lines to a sense amplifier corresponding to the one reference line among the plurality of sense amplifiers; and a second reference circuit for applying a second type of reference voltage for controlling the current supply capability of each of the plurality of current load circuits. The first reference circuit is electrically connected to the second reference circuit.

In one embodiment of the invention, the cell current division section includes a plurality of NMOS transistors. Each of the plurality of NMOS transistors includes a gate and a source connected to the gate.

In one embodiment of the invention, each of the plurality of NMOS transistors is connected to a current load circuit corresponding thereto among the plurality of current load circuits. The current supply capability of each of the plurality of NMOS transistors is different in accordance with the current supply capability of the current load circuit connected to the corresponding NMOS transistor.

In one embodiment of the invention, as the current supply capability of each of the plurality of NMOS transistors is higher, the current supply capability of the current load circuit connected thereto is lower; and as the current supply capability of each of the plurality of NMOS transistors is lower, the current supply capability of the current load circuit connected thereto is higher.

In one embodiment of the invention, the plurality of division sensing circuits operate in parallel.

In one embodiment of the invention, each of the plurality of memory cells is a multi-level memory cell.

In one embodiment of the invention, the first reference circuit includes a plurality of reference voltage setting circuits, each of which includes a plurality of current load circuits each connected to a reference element via one sub reference line corresponding thereto among a plurality of sub reference lines, and a current-voltage conversion circuit for converting a current flowing through one sub reference line among the plurality of sub reference lines into a reference voltage representing a potential of the one sub reference line. The reference voltage which is output from one reference voltage setting circuit among the plurality of reference voltage setting circuits controls the current supply capability of at least one of the plurality of current load circuits included in another reference voltage setting circuit among the plurality of reference voltage setting circuits.

In one embodiment of the invention, the second reference circuit includes a plurality of reference voltage setting circuits, each of which includes a plurality of current load circuits each connected to a reference element via one sub reference line corresponding thereto among a plurality of sub reference lines, and a current-voltage conversion circuit for converting a current flowing through one sub reference line among the plurality of sub reference lines into a reference voltage representing a potential of the one sub reference line. The reference voltage which is output from the first reference circuit controls the current supply capability of at least one of the plurality of current load circuits included in one reference voltage setting circuit among the plurality of reference voltage setting circuits.

According to one aspect of the invention, a reference circuit for generating a reference voltage for reading data from one memory cell among a plurality of memory cells is provided. The reference circuit includes a plurality of reference voltage setting circuits, each of which includes a plurality of current load circuits each connected to a reference element via one sub reference line corresponding thereto among a plurality of sub reference lines, and a current-voltage conversion circuit for converting a current flowing through one sub reference line among the plurality of sub reference lines into a reference voltage representing a potential of the one sub reference line. The reference voltage which is output from one reference voltage setting circuit among the plurality of reference voltage setting circuits controls the current supply capability of at least one of the plurality of current load circuits included in another reference voltage setting circuit among the plurality of reference voltage setting circuits.

In one embodiment of the invention, each of the plurality of current-voltage conversion circuits includes a reference current division section for connecting or separating the plurality of sub reference lines to or from the reference element.

In one embodiment of the invention, each of the plurality of reference current division sections includes a plurality of NMOS transistors. Each of the plurality of NMOS transistors includes a gate and a source connected to the gate.

In one embodiment of the invention, each of the plurality of NMOS transistors is connected to a current load circuit corresponding thereto among the plurality of current load circuits. The current supply capability of each of the plurality of NMOS transistors is different in accordance with the current supply capability of the current load circuit connected to the corresponding NMOS transistor.

In one embodiment of the invention, as the current supply capability of each of the plurality of NMOS transistors is higher, the current supply capability of the current load circuit connected thereto is lower; and as the current supply capability of each of the plurality of NMOS transistors is lower, the current supply capability of the current load circuit connected thereto is higher.

In one embodiment of the invention, the reference element has substantially the same structure as that of each of the plurality of memory cells.

In one embodiment of the invention, each of the plurality of current load circuits includes a PMOS transistor.

In one embodiment of the invention, the PMOS transistor of one current load circuit among the plurality of current load circuits included in one reference voltage setting circuit among the plurality of reference voltage setting circuits is current-mirror-connected with a PMOS transistor of one current load circuit among the plurality of current load circuits included in another reference voltage setting circuit among the plurality of reference voltage setting circuits.

According to one aspect of the invention, a reference circuit for generating a reference voltage for reading data from one memory cell among a plurality of memory cells is provided. The reference circuit includes a first reference circuit; and a second reference circuit. The first reference circuit includes a plurality of reference voltage setting circuits, each of which includes a plurality of current load circuits each connected to a reference element via one sub reference line corresponding thereto among a plurality of sub reference lines, and a current-voltage conversion circuit for converting a current flowing through one sub reference line among the plurality of sub reference lines into a reference voltage representing a potential of the one sub reference line. The reference voltage which is output from one reference voltage setting circuit among the plurality of reference voltage setting circuits controls the current supply capability of at least one of the plurality of current load circuits included in another reference voltage setting circuit among the plurality of reference voltage setting circuits. The second reference circuit includes a plurality of reference voltage setting circuits, each of which includes a plurality of current load circuits each connected to a reference element via one sub reference line corresponding thereto among a plurality of sub reference lines. a current-voltage conversion circuit for converting a current flowing through one sub reference line among the plurality of sub reference lines into a reference voltage representing a potential of the one sub reference line. The reference voltage which is output from the first reference circuit controls the current supply capability of at least one of the plurality of current load circuits included in a reference voltage setting circuit among the plurality of reference voltage setting circuits of the second reference circuit.

According to one aspect of the invention, a semiconductor memory device includes a memory cell array including a plurality of memory cells; and a reading circuit for reading data from one memory cell among the plurality of memory cells. The reading circuit includes a plurality of division sensing circuits each connected to the one memory cell via a sensing line corresponding thereto among a plurality of sensing lines; and a current-voltage conversion circuit for converting a current flowing through each of the plurality of sensing lines into a sensing voltage representing a potential of each of the plurality of sensing lines. Each of the plurality of division sensing circuits includes a current load circuit for supplying a current to the one memory cell via a corresponding sensing line among the plurality of sensing lines, and a sense amplifier for sensing a potential difference between the potential of the corresponding sensing line and a potential of a reference line corresponding thereto among a plurality of reference lines. The current load circuit included in at least one division sensing circuit among the plurality of division sensing circuits has a current supply capability which is different from the current supply capability of the current load circuit included in another division sensing circuits among the plurality of division sensing circuits.

In one embodiment of the invention, each of the plurality of memory cells is a multi-level memory cell.

According to one aspect of the invention, a semiconductor memory device includes a memory cell array including a plurality of memory cells; and a reference circuit for generating a reference voltage for reading data from one memory cell among the plurality of memory cells. The reference circuit includes a plurality of reference voltage setting circuits, each of which includes a plurality of current load circuits each connected to a reference element via one sub reference line corresponding thereto among a plurality of sub reference lines, and a current-voltage conversion circuit for converting a current flowing through one sub reference line among the plurality of sub reference lines into a reference voltage representing a potential of the one sub reference line. The reference voltage which is output from one reference voltage setting circuit among the plurality of reference voltage setting circuits controls the current supply capability of at least one of the plurality of current load circuits included in another reference voltage setting circuit among the plurality of reference voltage setting circuits.

A reading circuit according to the present invention functions as follows.

A plurality of division sensing circuits supply a plurality of division cell currents via a plurality of sensing lines. The plurality of division cell currents are joined together to form a cell current flowing through one memory cell. Each of the division cell current flowing through the sensing lines is processed with current-voltage conversion to provide a sensing voltage, which represents the potential of the sensing line. A potential difference between the potential of the sensing line and the potential of the reference line is sensed by the sense amplifier in each of the plurality of sensing circuits. Thus, a sensing operation can be performed at a plurality of different operating points in parallel.

A plurality of current load circuits for supplying a division cell current to the plurality of sensing lines respectively have different current supply capabilities. Therefore, the current supply capability can be set such that the sensing voltage conversion efficiency can be high at the operating point of the sense amplifier. Therefore, the operation margin can be larger than in a conventional reading circuit in which the load characteristic is substantially the same at a plurality of operating points.

For example, in the case where the current load circuit includes a PMOS transistor and a reference voltage is applied to the gate of the PMOS transistor, the current supply capability of the current load circuit can be controlled by the reference voltage.

In the case where the current load circuit includes a PMOS transistor as above, a nonlinear load characteristic in which the sensing voltage conversion efficiency is high only at and in the vicinity of the operating point can be obtained.

Another reference circuit may be provided in addition to a reference circuit for applying a reference voltage to be compared with the sensing voltage. In this case, the another reference circuit applies a reference voltage to the gate of the PMOS transistor of the current load circuit. Thus, the current supply capability can be controlled.

In this case, the two reference circuits can be electrically connected to each other, so that the reference voltage of one of the reference circuits can control the current supply capability of the other reference circuit.

In an embodiment of the present invention, the cell current division section includes a plurality of NMOS transistors in each of which the gate and the source are connected to each other, and the plurality of NMOS transistors have different current supply capabilities in accordance with the current supply capability of the current load circuit connected to the respective NMOS transistor. In this case, the operation margin can be further enlarged.

For example, each of the plurality of NMOS transistors included in the cell current division section is connected to the corresponding current load circuit. The current supply capability of the current load circuit and the current supply capability of the NMOS transistor are set as follows. As the current supply capability of the current load circuit is higher, the current supply capability of the NMOS transistor is lower; and as the current supply capability of the current load circuit is lower, the current supply capability of the NMOS transistor is higher. Thus, a larger amount of division cell current can be provided to the division sensing circuit for determining whether the cell current level is higher or lower than the prescribed reference current level, even in a region where the cell current level is low.

A reference circuit according to the present invention functions as follows.

A plurality of current load circuits supply a plurality of division reference currents via a plurality of sub reference lines. The plurality of division cell currents are joined together to form a reference current flowing through one reference element. The current supply capability of the current load circuit connected to each of a plurality of sub reference lines is controlled by the reference voltage which is output from the current load circuit of the other reference voltage setting circuit. Thus, a reference circuit having a nonlinear load characteristic substantially the same as that of the current load circuit included in the reading circuit can be realized.

The transistors included in the reading circuit and the reference circuit can have the same layout pattern, and therefore can easily have the same transistor characteristics. The reading circuit and the reference circuit are less likely to be influenced by variance of transistor characteristics.

In an embodiment of the present invention, each of a plurality of current load circuits includes a PMOS transistor, and the PMOS transistor included in the current load circuit in one reference voltage setting circuit can be current-mirror-connected with the PMOS transistor included in the current load circuit in another reference voltage setting circuit. Owing to such a structure, the current supply capability of the current load circuit can be controlled by the reference voltage which is output from the current load circuit in another reference voltage setting circuit.

In another embodiment of the present invention, the PMOS transistor included in the current load circuit in the reference voltage setting circuit is current-mirror-connected with the PMOS transistor included in the current load circuit in the divisional sensing circuit. Owing to such a structure, the current supply capability of the current load circuit in the reading circuit can be controlled by the reference voltage which is output from the current load circuit in the reference voltage setting circuit.

The reference voltage supplied from the reference circuit may be connected to the gate of the PMOS transistor included in the current load circuit in the reference voltage setting circuit. The current supply capability of the current load circuit can be controlled also by such a structure.

An appropriate reference element can easily be obtained as follows. An element having the same structure as that of the memory cell is used, and the threshold thereof is adjusted such that the element has the same characteristics as those of the memory cell.

Thus, the invention described herein makes possible the advantages of providing a reading circuit and reference circuit for enlarging the reading operation margin in a multi-level memory cell and increasing the reading speed from the multi-level memory cell, and a semiconductor memory device including such a reading circuit and such a reference circuit.

These and other advantages of the present invention will become apparent to those skilled in the art upon reading and understanding the following detailed description with reference to the accompanying figures.

BRIEF DESCRIPTION OF THE DRAWINGS

FIG. 13 shows an exemplary truth table of a logic circuit for receiving the output of the sense amplifier;

DESCRIPTION OF THE PREFERRED EMBODIMENTS

Hereinafter, the present invention will be described by way of illustrative examples with reference to the accompanying drawings.

In the following examples, an operation of reading data from a nonvolatile semiconductor memory device as an example of a semiconductor memory device will be described. The present invention is applicable to any semiconductor memory device adopting a current sensing system for reading data, and is not limited to nonvolatile or volatile semiconductor memory devices.

In the following examples, only the operation for reading data is described. A writing circuit, an erasing circuit, a control circuit and other elements of the nonvolatile semiconductor memory device are omitted.

EXAMPLE 1

Figure 1:
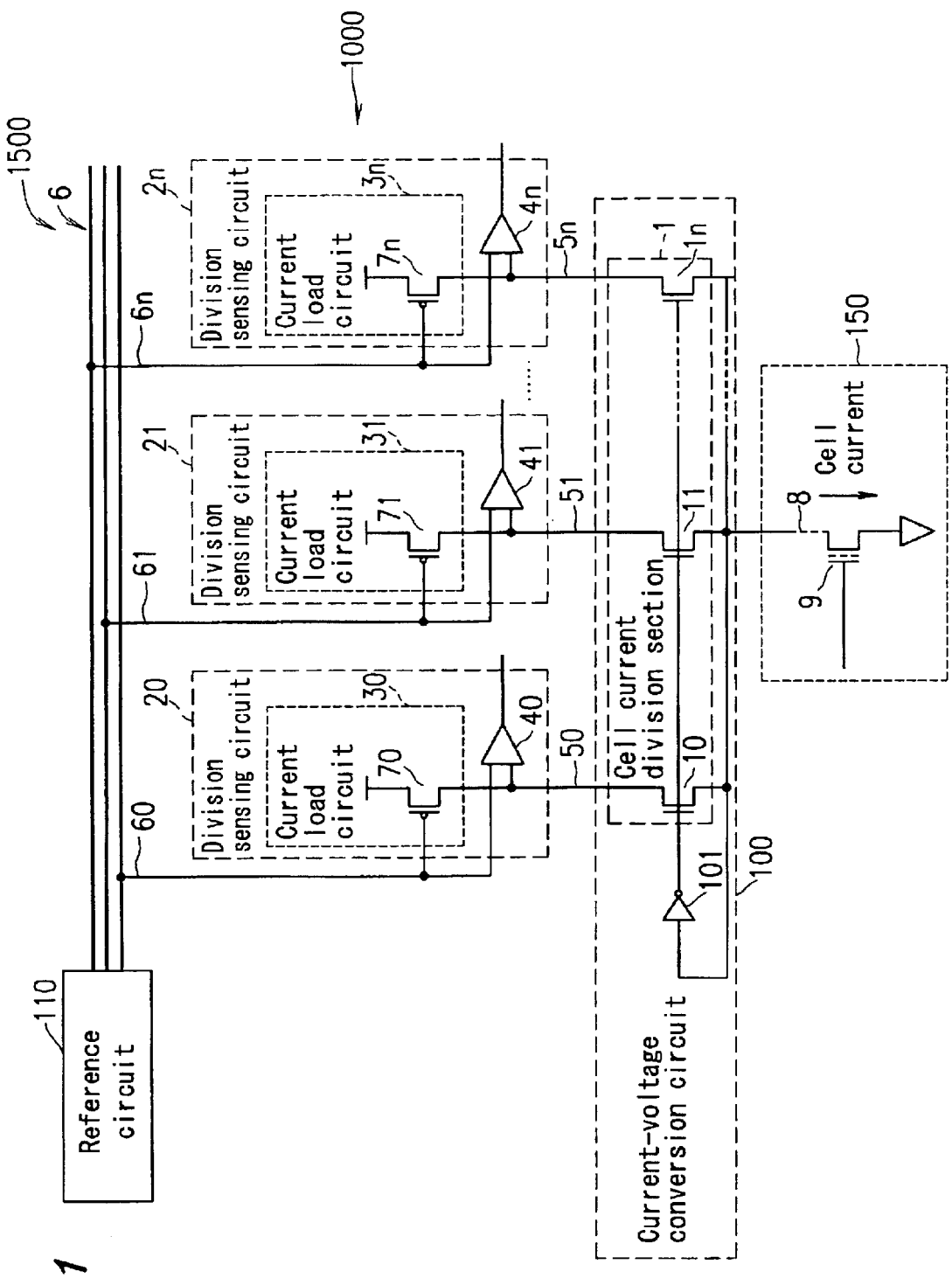
FIG. 1 is a schematic view of a semiconductor memory device according to a first example of the present invention.

FIG. 1 is a schematic view of a semiconductor memory device 1500 according to a first example of the present invention.

The semiconductor memory device 1500 includes a memory cell array 150 including a plurality of memory cells, a reading circuit 1000 for reading data from one of the plurality of memory cells, and a reference circuit 110 for generating a reference voltage for reading data.

In FIG. 1, the reading circuit 1000 is shown as reading data from only one memory cell. This is merely exemplary, and the reading circuit 1000 may read data from one selected memory cell 9 among the plurality of memory cells.

As shown in FIG. 1, the reading circuit 1000 supplies a cell current to the selected memory cell 9, among the plurality of memory cells, via a bit line 8 and converts the level of the cell current flowing through the memory cell 9 into a sensing voltage by current-voltage conversion. Then, the reading circuit 1000 compares the sensing voltage with a reference voltage, and thus reads data stored in the memory cell 9.

The reading circuit 1000 includes a plurality of division sensing circuits 20 through 2n and a current-voltage conversion circuit 100. The number of the plurality of division sensing circuits included in the reading circuit 1000 is any integer of 2 or greater.

The division sensing circuit 20 is connected to the current-voltage conversion circuit 100 via a sensing line 50. The division sensing circuit 20 includes a current load circuit 30 for supplying a division cell current to the sensing line 50, and a sense amplifier 40 for sensing and amplifying the potential difference between the potential of the sensing line 50 and a potential of a reference line 60.

The division sensing circuit 21 is connected to the current-voltage conversion circuit 100 via a sensing line 51. The division sensing circuit 21 includes a current load circuit 31 for supplying a division cell current to the sensing line 51, and a sense amplifier 41 for sensing and amplifying the potential difference between the potential of the sensing line 51 and a potential of a reference line 61.

FIG. 1 shows the division sensing circuit 2n. The letter "n" in this reference numeral represents an integer of 1 or greater. FIG. 1 also shows a current load circuit 3n, a sense amplifier 4n, a sensing line 5n, a reference line 6n, and a PMOS transistor 7n. The "n" in these reference numerals also represents an integer of 1 or greater. This means that the reading circuit 1000 includes at least two division sensing circuits, at least two current load circuits, at least two sense amplifiers, at least two sensing lines, at least two reference lines, and at least two PMOS transistors.

In the following description, "n" is 2 or greater; i.e., the reading circuit 1000 includes at least three division sensing circuits, at least three current load circuits, at least three sense amplifiers, at least three sensing lines, at least three reference lines, and at least three PMOS transistors.

In the following description, reference lines 60 through 6n will be collectively referred to as a "reference line group 6".

The current-voltage conversion circuit 100 converts the division sensing current flowing through the sensing line 50 into a sensing voltage representing the potential of the sensing line 50, converts the division sensing current flowing through the sensing line 51 into a sensing voltage representing the potential of the sensing line 51, and similarly converts the division sensing current flowing through the sensing line 5n into a sensing voltage representing the potential of the sensing line 5n.

According to the present invention, a cell current flowing through one memory cell is formed by a plurality of division cell currents being joined together. According to the present invention, the cell current is not "divided", but the cell current level can be considered as being divided into levels of division cell currents respectively flowing through a plurality of sensing lines.

The current-voltage conversion circuit 100 includes a cell current division section 1 for connecting or separating the sensing lines 50 through 5n to or from the memory cell 9 via the bit line 8, and an inverter 101 for controlling the cell current division section 1.

In this example, the cell current division section 1 includes an NMOS transistor 10 having a gate and a source connected to each other via the inverter 101, an NMOS transistor 11 having a gate and a source connected to each other via the inverter 101, and similarly, an NMOS transistor 1n having a gate and a source connected to each other via the inverter 101.

In this example, the current load circuit 30 includes a PMOS transistor 70. A gate of the PMOS transistor 70 receives a reference voltage via the reference line 60. The reference voltage of the reference line 60 controls the current supply capability of the current load circuit 30.

The current load circuit 31 includes a PMOS transistor 71. A gate of the PMOS transistor 71 receives a reference voltage via the reference line 61. The reference voltage of the reference line 61 controls the current supply capability of the current load circuit 31.

Similarly, the current load circuit 3n includes a PMOS transistor 7n. A gate of the PMOS transistor 7n receives a reference voltage via the reference line 6n. The reference voltage of the reference line 6n controls the current supply capability of the current load circuit 3n.

In the reading circuit 1000, at least one of the plurality of current load circuits 30 through 3n included in the division sensing circuits 20 through 2n has a current supply capability which is different from that of the other division sensing circuits.

The reference circuit 110 applies a reference voltage to gates of the PMOS transistors 70 through 7n of the current load circuits 30 through 3n via the reference lines 60 through 6n respectively corresponding to the plurality of division sensing circuits 20 through 2n.

In the above description, the reference circuit 110 is not included in the reading circuit 1000. Alternatively, the reading circuit 1000 may include the reference circuit 110.

Figure 2:
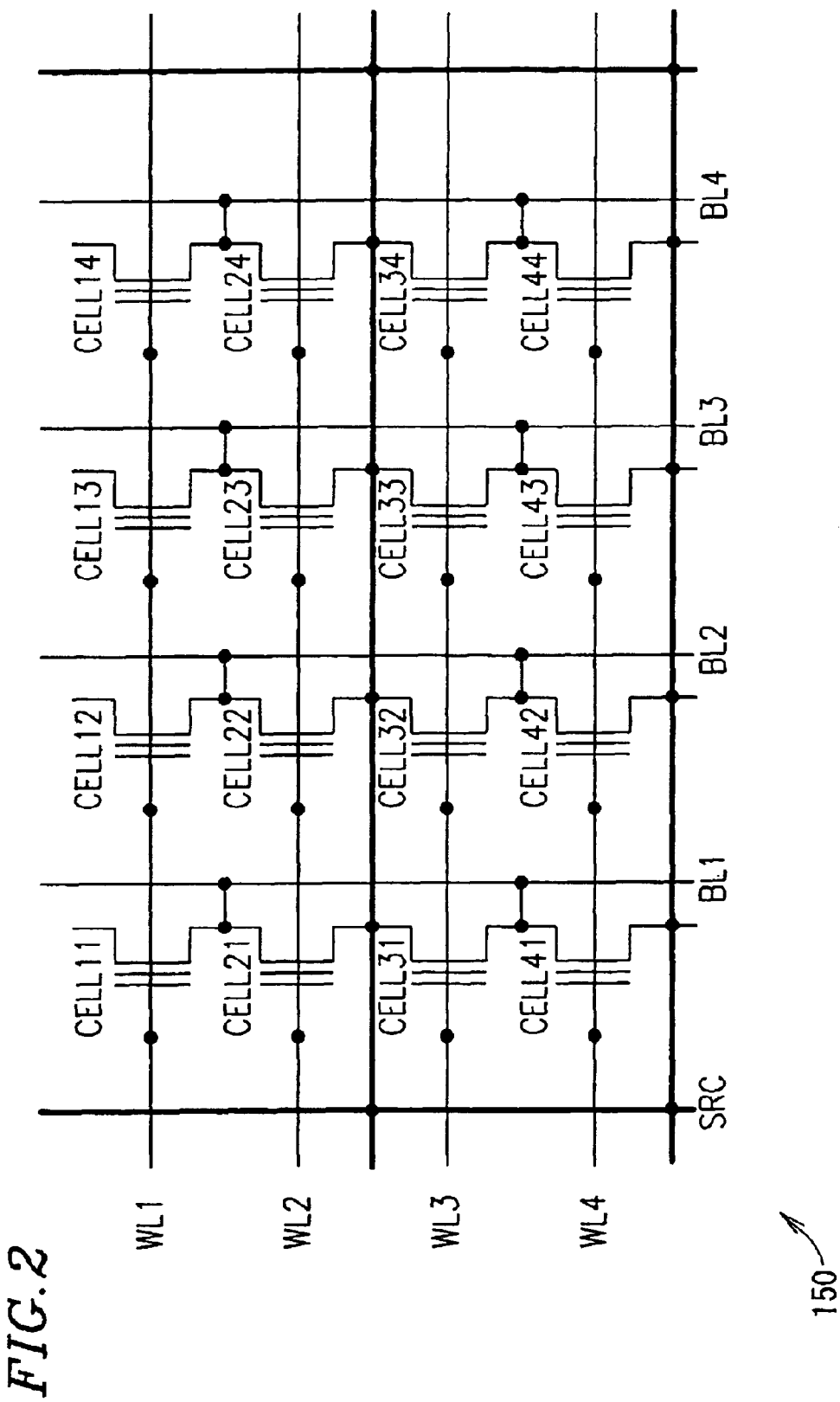
FIG. 2 is a circuit diagram illustrating a memory cell array of the semiconductor memory device shown in FIG. 1.

FIG. 2 is a circuit diagram illustrating a part of a memory cell array 150 from which is data is read by the reading circuit 1000.

The memory cell array 150 shown in FIG. 2 includes a plurality of memory cells CELL11 through CELL44 in a matrix.

Gates of the memory cells in respective rows of the memory cells array 150 are commonly connected to word lines WL1 through WL4. Specifically, the word line WL1 is connected to gates of the memory cells CELL11 through CELL14, and the word line WL2 is connected to gates of the memory cells CELL21 through CELL24. The word line WL3 is connected to gates of the memory cells CELL31 through CELL34, and the word line WL4 is connected to gates of the memory cells CELL41 through CELL44.

Drains of the memory cells in respective columns of the memory cells array 150 are commonly connected to bit lines BL1 through BL4. Specifically, the bit line BL1 is connected to drains of the memory cells CELL11 through CELL41, and the bit line BL2 is connected to drains of the memory cells CELL12 through CELL42. The bit line BL3 is connected to drains of the memory cells CELL13 through CELL43, and the bit line BL4 is connected to drains of the memory cells CELL14 through CELL44.

The drains of two adjacent memory cells in each column are connected to each other and then connected to the bit line. For example, the drains of the memory cells CELL11 and CELL21 are connected, and these drains are connected to the bit line BL1. The drains of the memory cells CELL31 and CELL41 are connected, and these drains are connected to the bit line BL1.

The word lines WL1 through WL4 and the bit lines BL1 through BL4 are provided to be perpendicular to each other.

Sources of the memory cells CELL11 through CELL44 are commonly connected to a common source line SRC on a block-by-block basis. Each block includes a plurality of memory cells.

The sources of two adjacent memory cells in each column are connected to each other. For example, the sources of the memory cells CELL21 and CELL31 are connected, and these sources are connected to the common source line SRC.

The plurality of bit lines BL1 through BL4 are connected to, for example, the division sensing circuits 20 through 2n via a decoder circuit (not shown) or the current-voltage conversion circuit 100 (FIG. 1).

The reference circuit 110 (FIG. 1) includes memory cells, as reference cells, similar to the memory cells in the memory cell array 150.

Returning to FIG. 1, an operation of the reading circuit 1000 in this example will be described.

Figure 9A:
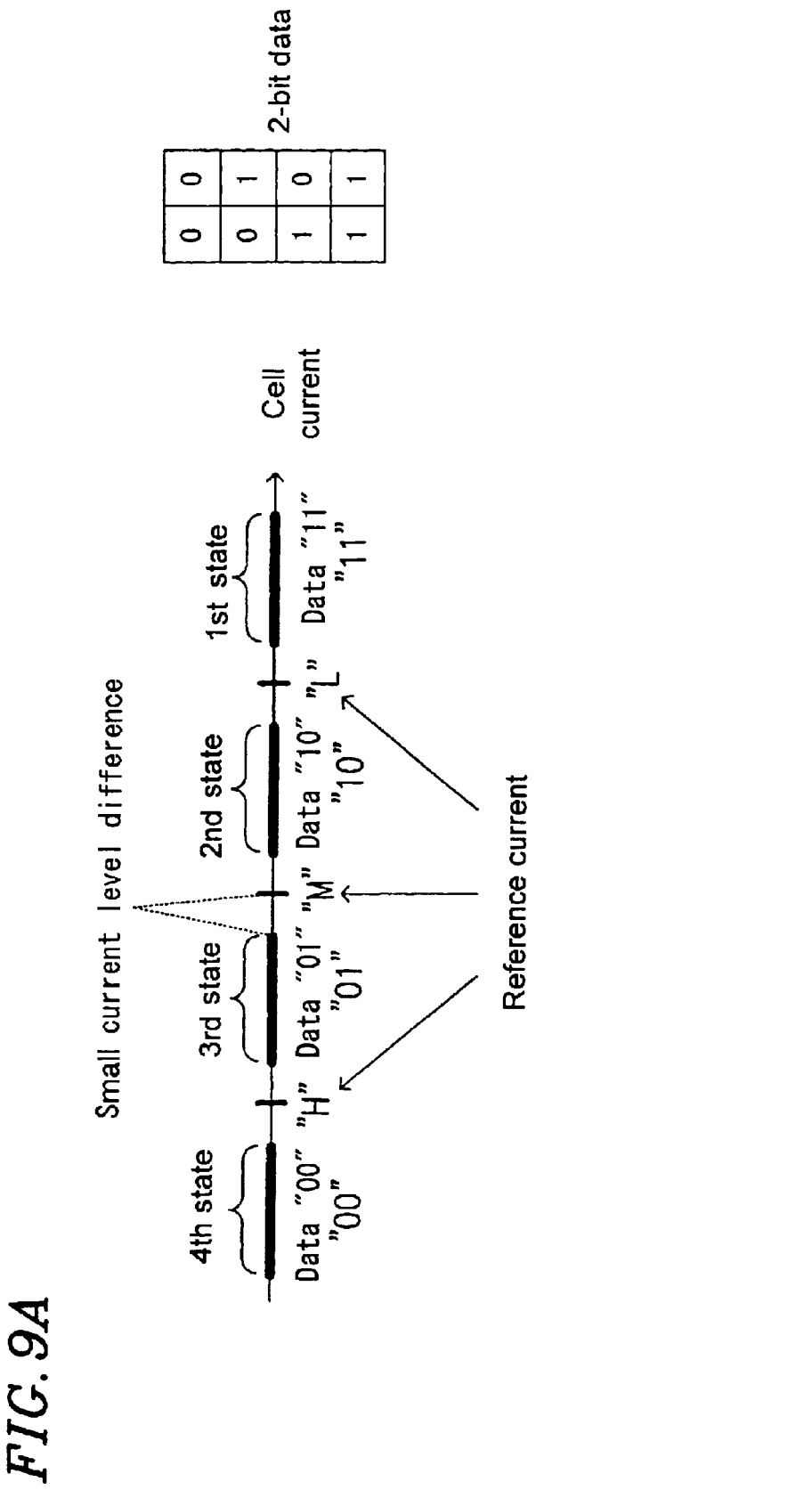
FIG. 9A shows an exemplary relationship between the cell current and the data in a conventional multi-level memory cell.

In this example, a circuit configuration for reading data from a multi-level memory cell which can store 2-bit data as shown in FIG. 9A will be described. "n" in the reference numerals in FIG. 1 is assumed to be 2. Accordingly, the following elements will be described as bearing the following reference numerals. The NMOS transistor 1n is 12. The division sensing circuit 2n is 22. The current load circuit 3n is 32. The sense amplifier 4n is 42. The sensing line 5n is 52. The reference line 6n is 62. The PMOS transistor 7n included in the current load circuit 32 is 72.

For reading data from a memory cell which can store m-bit data (m is an integer of 2 or greater), n is set as $2^m-1$.

In the following description, the potential of the sensing line will be referred to as a "sensing voltage", and the potential of the reference line will be referred to as a "reference voltage".

Figure 9B:
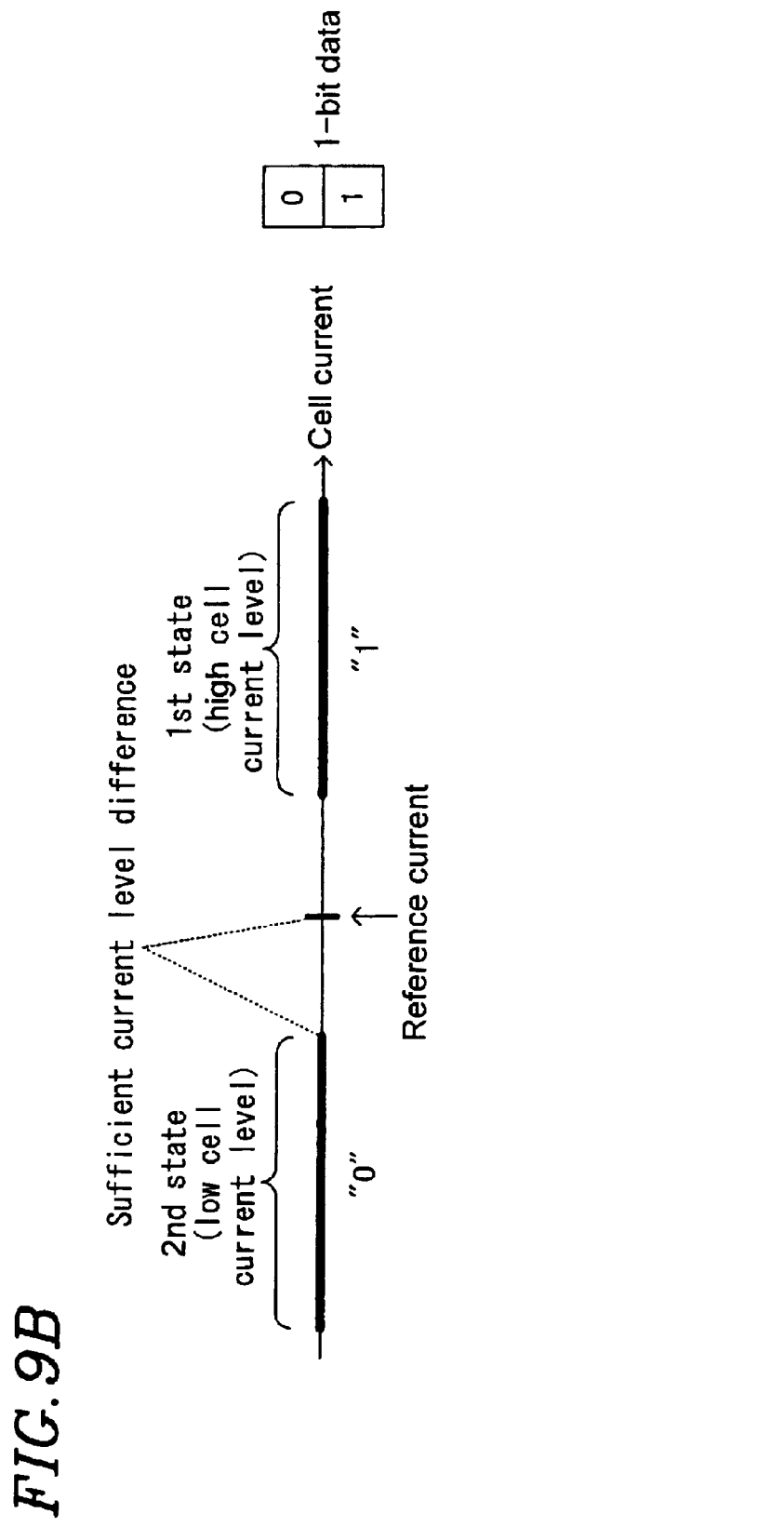
FIG. 9B shows an exemplary relationship between the cell current and the data in a conventional two-level memory cell.
Figure 10:
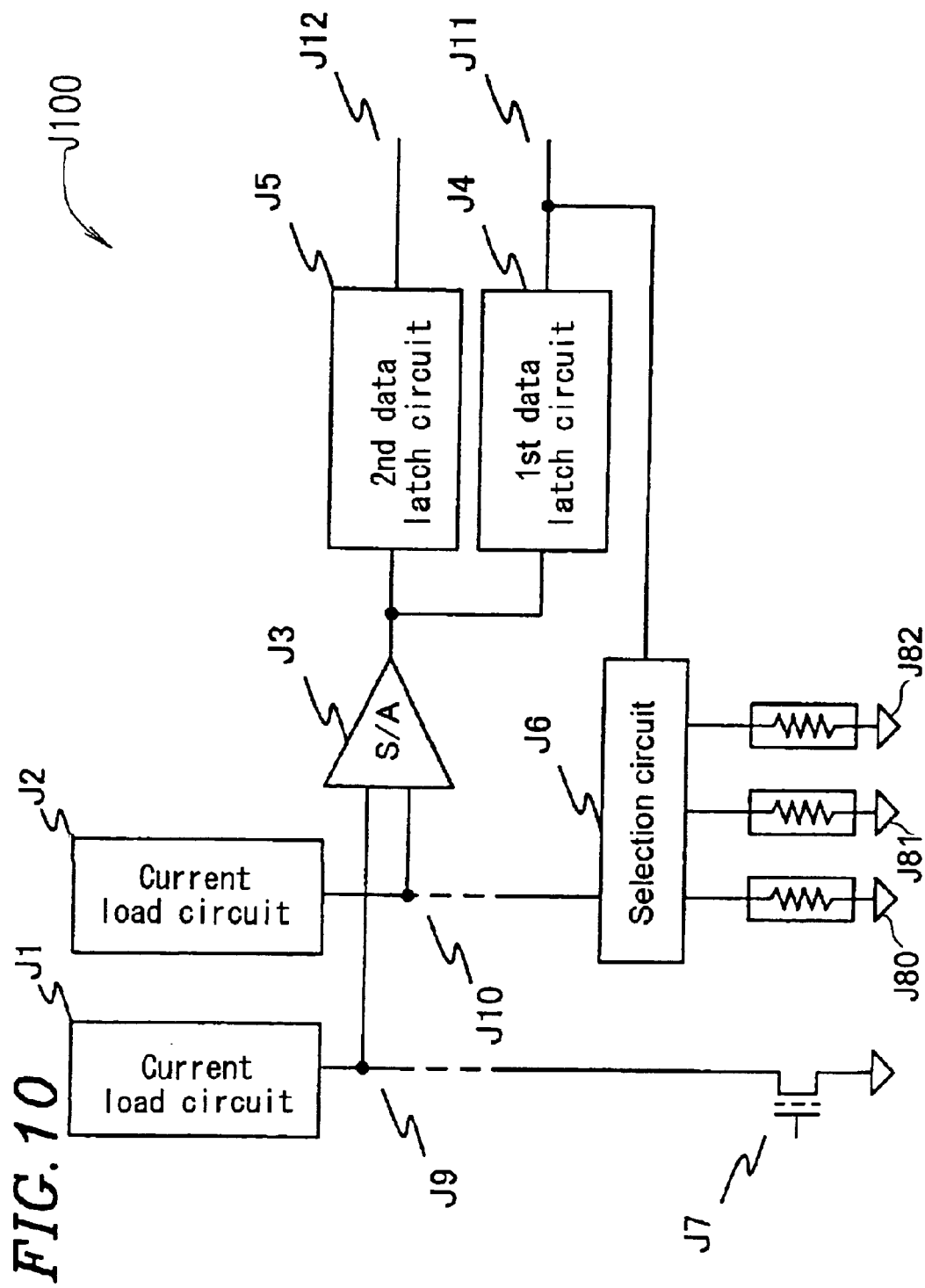
FIG. 10 is a circuit diagram illustrating a conventional time division sensing type reading circuit.
Figure 11:
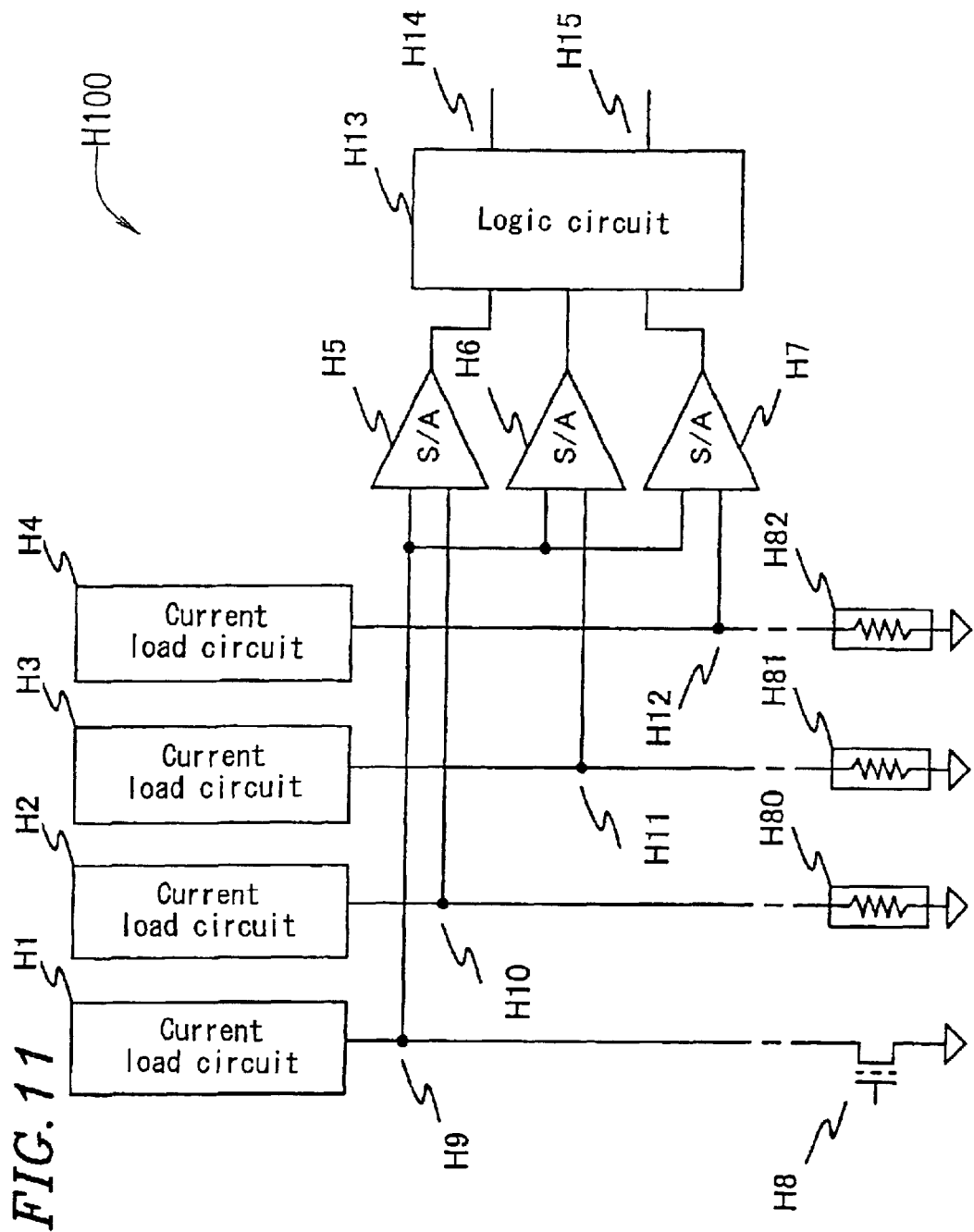
FIG. 11 is a circuit diagram illustrating a conventional parallel sensing type reading circuit.
Figure 12:
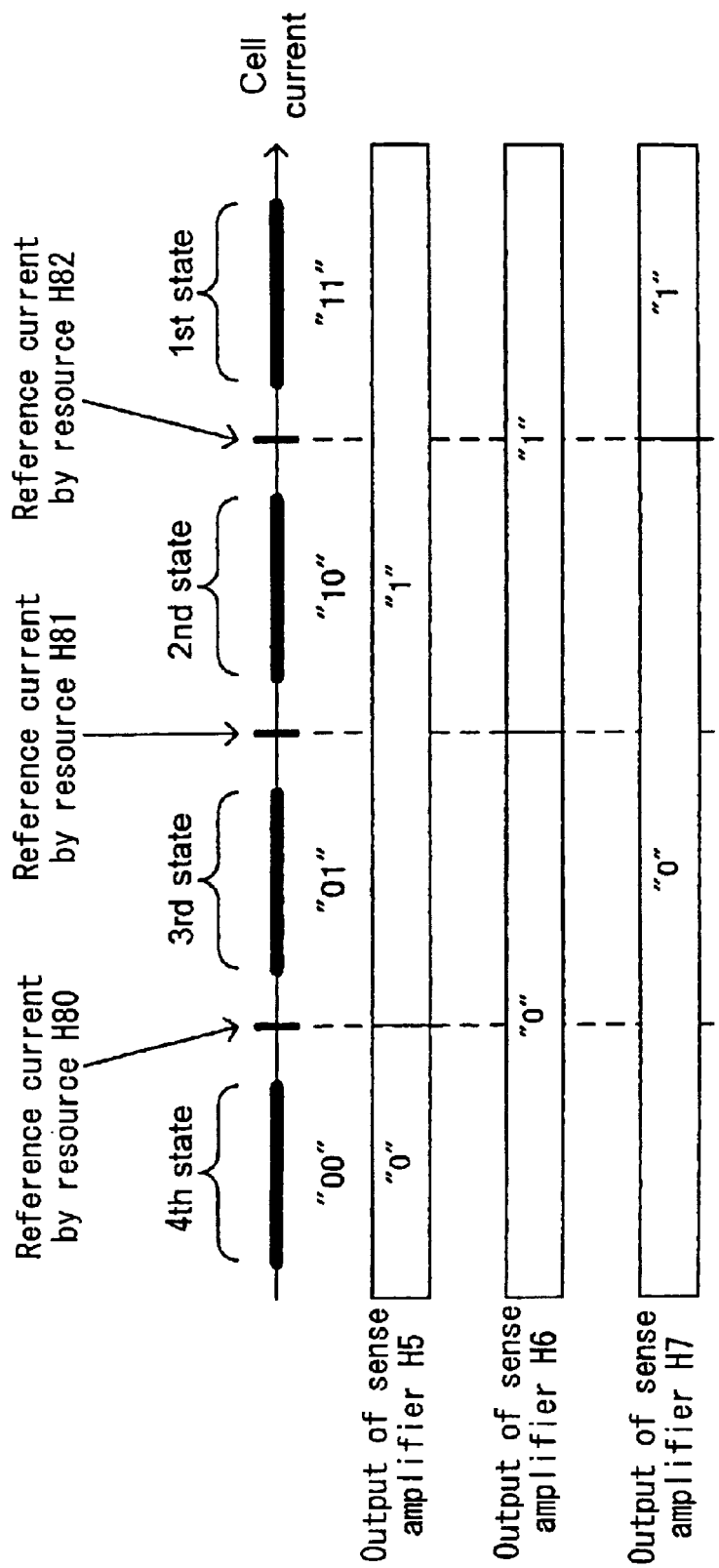
FIG. 12 shows an exemplary relationship between the data and the output of the sense amplifier when data is read from a memory cell which can store 2-bit data.
Figure 14A:
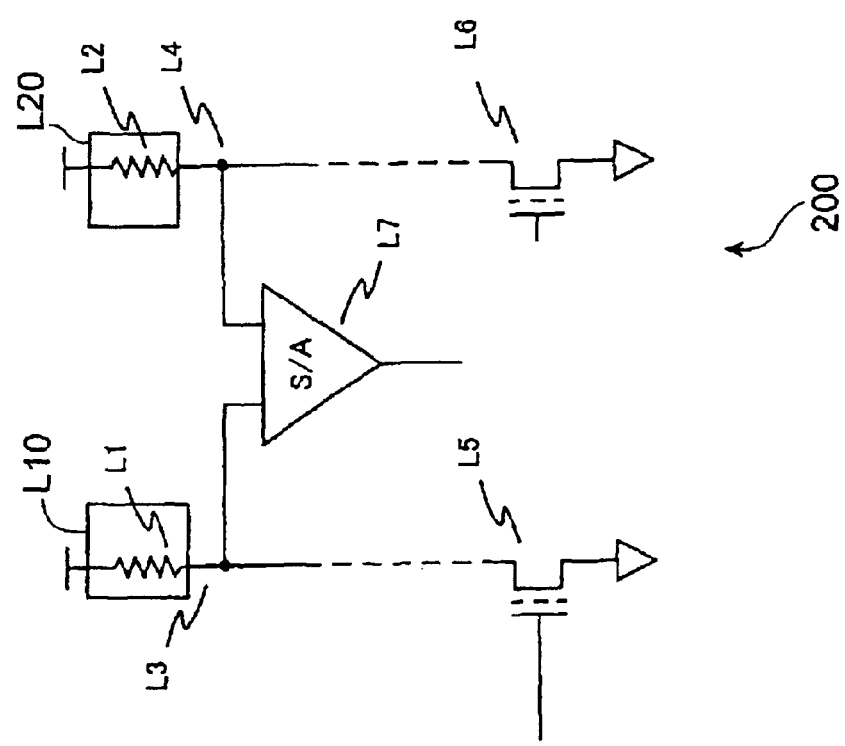
FIG. 14A is a circuit diagram illustrating a reading circuit having a linear load characteristic.
Figure 14B:
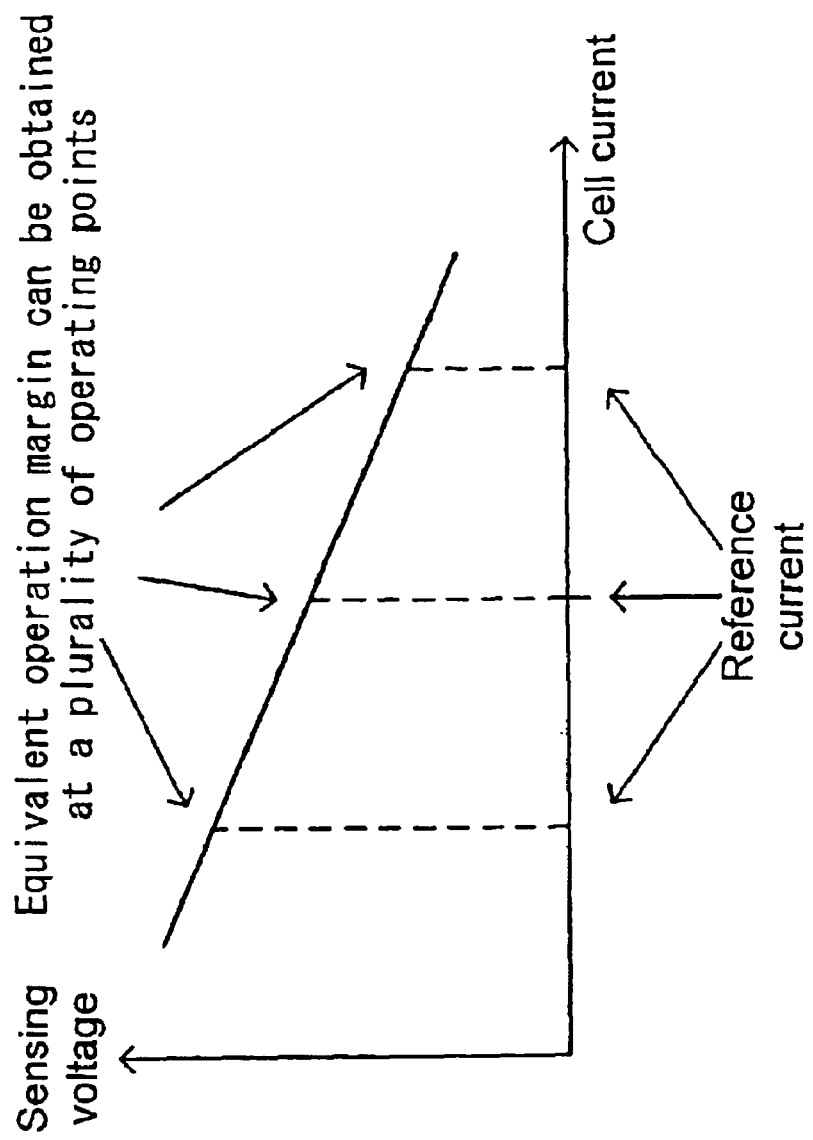
FIG. 14B is a graph illustrating an exemplary characteristic of the circuit shown in FIG. 14A.

Before describing an operation for reading data from a multi-level memory cell, an operation of the reading circuit 1000 performed for reading data from a two-level memory cell as shown in FIG. 9B will be first described for easier understanding.

In the following description, the reference lines 60 through 62 have the same level of reference voltage. The NMOS transistors 10 through 12 have the same size. The PMOS transistors 70 through 72 have the same size. The current supply capability of each of the NMOS transistors 10 through 12 and the PMOS transistors 70 through 72 is mainly determined by the transistor size and the gate potential. The NMOS transistors 10 through 12 have the same gate potential, and therefore have the same current supply capability. The PMOS transistors 70 through 72 have the same gate potential, and therefore have the same current supply capability. In other words, since the reference lines 60 through 62 have the same potential, the PMOS transistors 70 through 72 have the same current supply capability.

When an appropriate voltage is applied to a gate of the selected memory cell 9, the potential of the bit line 8 is decreased, and thus the potential which is input to the inverter 101 connected to the bit line 8 is decreased. As a result, the potential of the output from the inverter 101 is increased. Thus, the NMOS transistors 10 through 12 included in the cell current division section 1 become conductive.

When the NMOS transistors 10 through 12 become conductive, the potentials of the sensing lines 50 through 52 are decreased in accordance with the potential of the bit line 8. Thus, a sufficient potential difference is generated between the source and the drain of each of the PMOS transistors 70 through 72 respectively included in the current load circuits 30 through 32.

In this state, a reference voltage is applied to the reference lines 60 through 62, and the PMOS transistors 70 through 72 become conductive. Then, the bit line 8 is charged via the sensing lines 50 through 52 and the NMOS transistors 10 through 12. When the potential of the bit line 8 is increased, a potential difference is generated between the drain and the source of the memory cell 9, and thus a cell current flows.

In order to perform a sensing operation accurately, the reference voltage applied to the division sensing circuits 20 through 22 via the reference lines 60 through 62 is set to be equal to the sensing voltage of the sensing lines 50 through 52 when the cell current level is equal to the reference current level, as described above with reference to FIG. 9B.

When the bit line 8 is charged to a prescribed potential, the potential of the output from the inverter 101 included in the current-voltage conversion circuit 100 is decreased, and thus the current supply capability of each of the NMOS transistors 10 through 12 is reduced. When the potential of the bit line 8, the level of the cell current flowing through the memory cell 9, and the level of the current flowing through the NMOS transistors 10 through 12 reach an equilibrium state, the potentials and the levels of the currents in the reading circuit 1000 are stabilized.

Since the reference lines 60 through 62 have the same potential, the NMOS transistors 10 through 12 have the same gate potential and the same drain-source potential. Thus, the same level of drain-source current can flow through the NMOS transistors 10 through 12. Accordingly, the level of the current flowing in each of the NMOS transistors 10 through 12 is ⅓ of the level of the cell current. At this point, the sensing lines 50 through 52 obtain an equal sensing voltage due to the PMOS transistors 70 through 72.

The potential differences between the potentials of the sensing lines 50 through 52 and the potentials of the reference lines 60 through 62 are sensed and amplified by the sense amplifiers 40 through 42, respectively. Thus, data is read. As described above, the sensing lines 50 through 52 have the same potential. Therefore, the sense amplifiers 40 through 42 perform the same operation and output the same result. Accordingly, when the reference lines 60 through 62 have the same potential, 1-bit data of "1" or "0" is read from the memory cell 9.

Next, an operation of the reading circuit 1000 for reading data from a multi-level memory cell according to the first example will be described. In the following description, a multi-level memory cell can store 2-bit data, i.e., four values.

In this example, the NMOS transistors 10 through 12 have the same transistor size as in the case of the two-level memory cell. The PMOS transistors 70 through 72 also have the same transistor size. Accordingly, the NMOS transistors 10 through 12 have the same gate potential and thus have the same current supply capability.

In order to perform the reading operation accurately, the circuit constants such as the transistor size and the like, and the reference voltage are determined such that the potentials of the sensing lines 50 through 52 are respectively equal to the potentials of the reference lines 60 through 62 (the reference voltages applied to the reference lines 60 through 62) when the cell current level is equal to each reference current level. The potentials of the reference lines 60 through 62 are not equal, unlike in the case of reading data from the two-level memory cell, and are set as follows.

The reference voltage applied to the reference line 60 is set to be equal to the sensing voltage of the sensing line 50 when the cell current level is equal to the reference current level "H" between data "00" and data "01" (FIG. 9A).

The reference voltage applied to the reference line 61 is set to be equal to the sensing voltage of the sensing line 51 when the cell current level is equal to the reference current level "M" between data "01" and data "10" (FIG. 9A).

Similarly, the reference voltage applied to the reference line 62 is set to be equal to the sensing voltage of the sensing line 52 when the cell current level is equal to the reference current level "L" between data "10" and data "11" (FIG. 9A).

Thus, the potentials of the reference lines 60 through 62 are set to be relatively high, medium and low, respectively.

When an appropriate voltage is applied to the gate of the selected memory cell 9, the potential of the bit line 8 is decreased. As a result, the potential of the output from the inverter 101 included in the current-voltage conversion circuit 100 is increased. Thus, the NMOS transistors 10 through 12 included in the cell current division section 1 become conductive. Then, the potentials of the sensing lines 50 through 52 are decreased in accordance with the potential of the bit line 8. Thus, a sufficient potential difference is generated between the source and the drain of each of the PMOS transistors 70 through 72 respectively included in the current load circuits 30 through 32.

In this state, a reference voltage is applied to the reference lines 60 through 62, and the PMOS transistors 70 through 72 become conductive. Then, the bit line 8 is charged via the sensing lines 50 through 52 and the NMOS transistors 10 through 12. When the potential of the bit line 8 is increased, a potential difference is generated between the drain and the source of the memory cell 9, and thus a cell current flows. Notably, a PMOS transistor has a characteristic that as the reference voltage applied to the gate thereof is higher, the level of the current flowing through the PMOS transistor is lower.

When the bit line 8 is charged to a prescribed potential, the potential of the output from the inverter 101 included in the current-voltage conversion circuit 100 is decreased, and thus the current supply capability of each of the NMOS transistors 10 through 12 is reduced. When the potential of the bit line 8, the level of the cell current flowing through the memory cell 9, and the level of the current flowing through the NMOS transistors 10 through 12 reach an equilibrium state, the potentials and the levels of the currents in the reading circuit 1000 are stabilized.

When the NMOS transistors 10 through 12 operate in a saturation region (a pentode region), the NMOS transistors 10 through 12 have the same gate potential. Thus, the NMOS transistors 10 through 12 can allow substantially the same level of drain-source currents to flow therethrough, without significantly relying on the drain-source potentials thereof.

The PMOS transistor 70 has a different current supply capability from those of the PMOS transistors 71 and 72, since the reference lines 60 through 62 have different potentials. Specifically, the potential of the reference line 60 is larger than those of the reference lines 61 and 62, and therefore the current supply capability of the PMOS transistor 70 is lower than those of the PMOS transistors 71 and 72.

Accordingly, when the NMOS transistors 10 through 12 have substantially the same current supply capability, the potential of the sensing line 50 is lower than those of the sensing lines 51 and 52.

The potential of the reference line 61 is higher than that of the reference line 62, and therefore the current supply capability of the PMOS transistor 71 is lower than that of the PMOS transistor 72.

Accordingly, the potential of the sensing line 51 is lower than that of the sensing line 52.

Now, the relationship between the reference voltage and the sensing voltage will be discussed. As described above, the reference voltage is set to be equal to the sensing voltage when the cell current level is equal to the reference current level. Therefore, when the cell current level is higher than the reference current level, the current supply capability of each of the NMOS transistors 10 through 12 included in the cell current division section 1 is increased. As can be appreciated, as the cell current level is higher than the reference current level, the potential of the sensing line is dropped by a larger level and thus the sensing voltage becomes lower than the reference voltage.

Conversely, when the cell current level is lower than the reference current level, the sensing voltage becomes higher than the reference voltage.

The data is read by amplifying the potential differences between the potentials of the sensing lines 50 through 52 and the potentials of the reference lines 60 through 62 by the sense amplifiers 40 through 42 respectively. The sense amplifiers 40 through 42 each output "0" when the potential of the sensing line is higher than the potential of the corresponding reference line, and output "1" when the potential of the sensing line is lower than the potential of the corresponding reference line.

For example, when the cell current level of memory cell 9 is in the fourth state (FIG. 9A) corresponding to data "00", the cell current level is lower than any of the three reference current levels. Therefore, the potentials of the sensing lines 50 through 52 are higher than those of the reference lines 60 through 62 respectively. As a result, the sense amplifiers 40 through 42 each output "0". The 3-bit data "000" output from the sense amplifiers 40 through 42 is decoded by a logic circuit (not shown in FIG. 1) which realizes the truth table shown in FIG. 13. Thus, 2-bit data "00" is read.

Similarly, when the cell current level of memory cell 9 is in the second state (FIG. 9A) corresponding to data "10", the cell current level is higher than the reference current levels "H" and "M", but lower than the reference current level "L". Therefore, the potentials of the sensing lines 50 and 51 are lower than those of the reference lines 60 and 61 respectively. The potential of the sensing line 52 is higher than that of the reference line 62. As a result, the sense amplifiers 40 through 42 output 3-bit data "110". The 3-bit data "110" is decoded by the above-mentioned logic circuit. Thus, 2-bit data "10" is read.

Data is read in substantially the same manner when the cell current level of memory cell 9 is in the third state (FIG. 9A) corresponding to data "01" and in the first state corresponding to data "11".

As described above, the reading circuit 1000 can read multi-level data by the parallel sensing system by operating the division sensing circuits 20 through 2n in parallel.

Figure 15A:
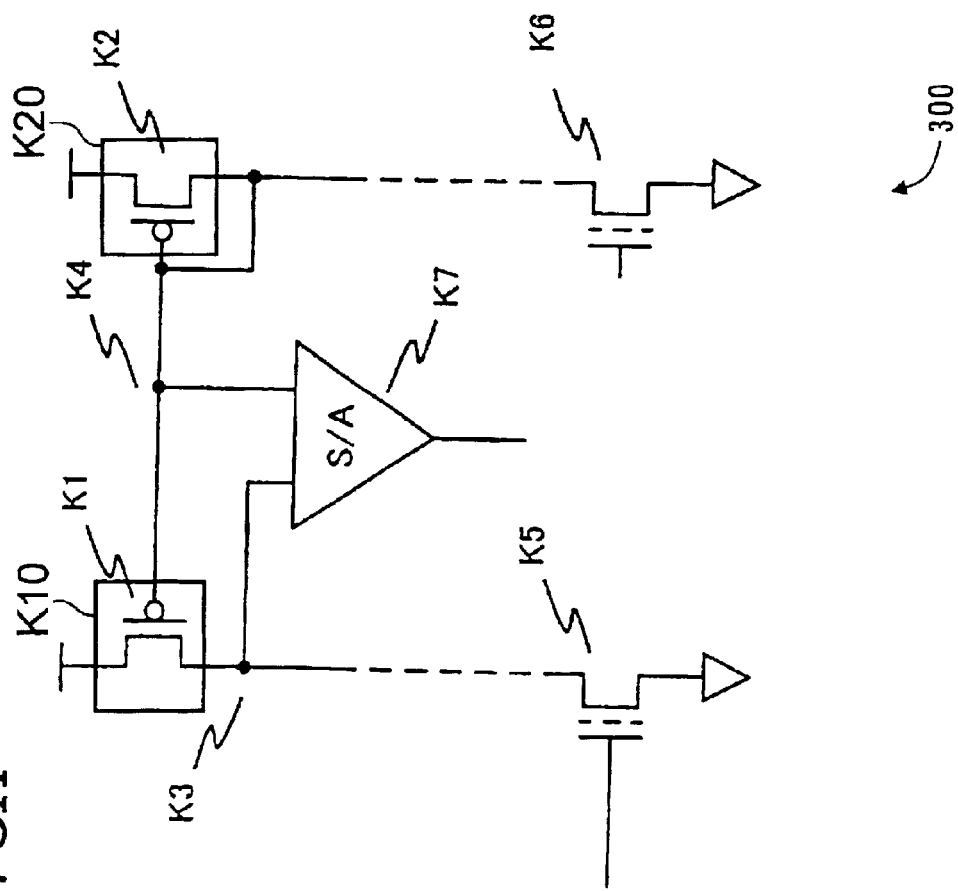
FIG. 15A is a circuit diagram illustrating a reading circuit having a nonlinear load characteristic.
Figure 15B:
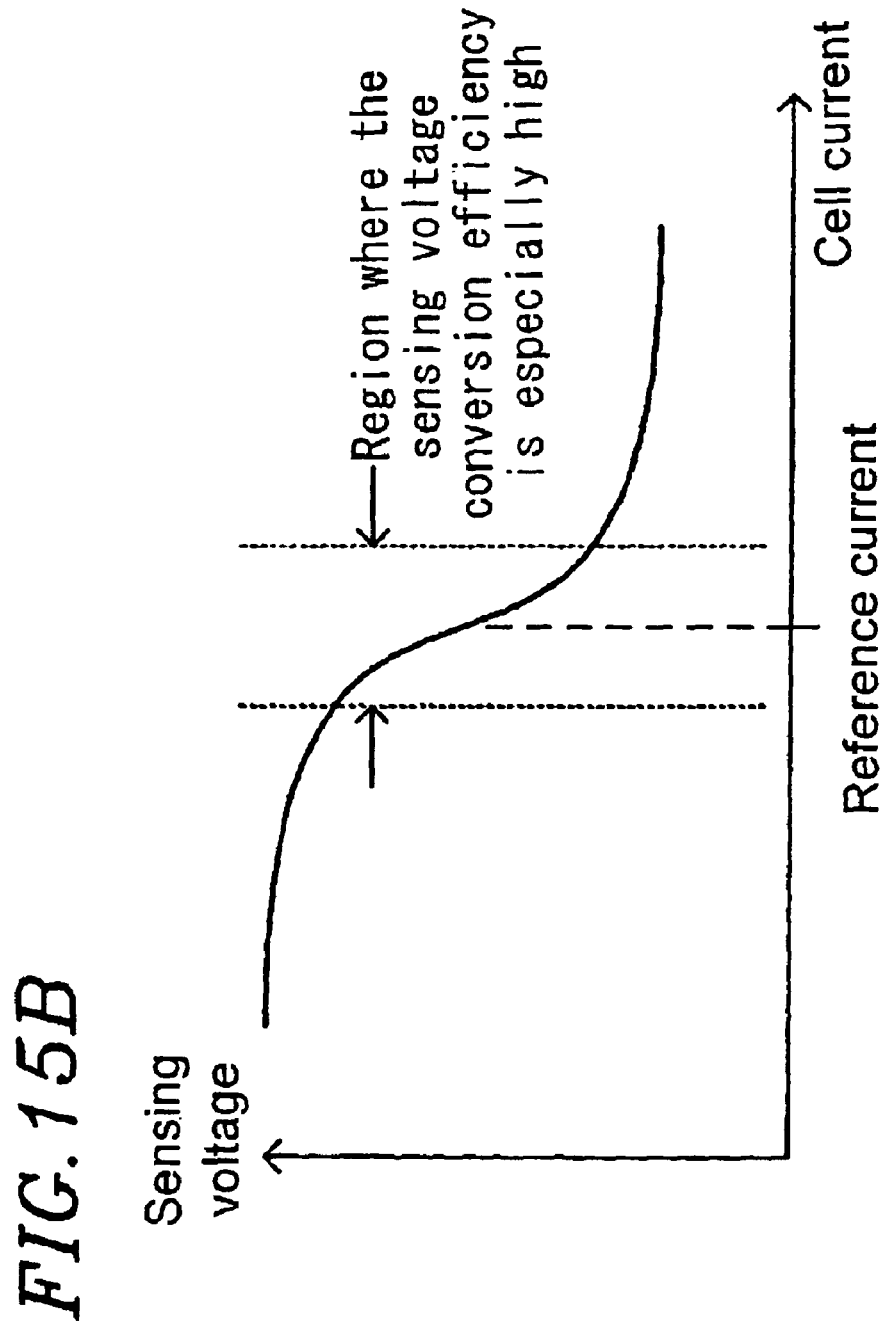
FIG. 15B is a graph illustrating an exemplary characteristic of the circuit shown in FIG. 15A.

Since the current load circuits 30 through 3n respectively include PMOS transistors 70 through 7n, the division sensing circuits 20 through 2n can each operate as a circuit having a nonlinear characteristic as shown in FIG. 15B.

Figure 3:
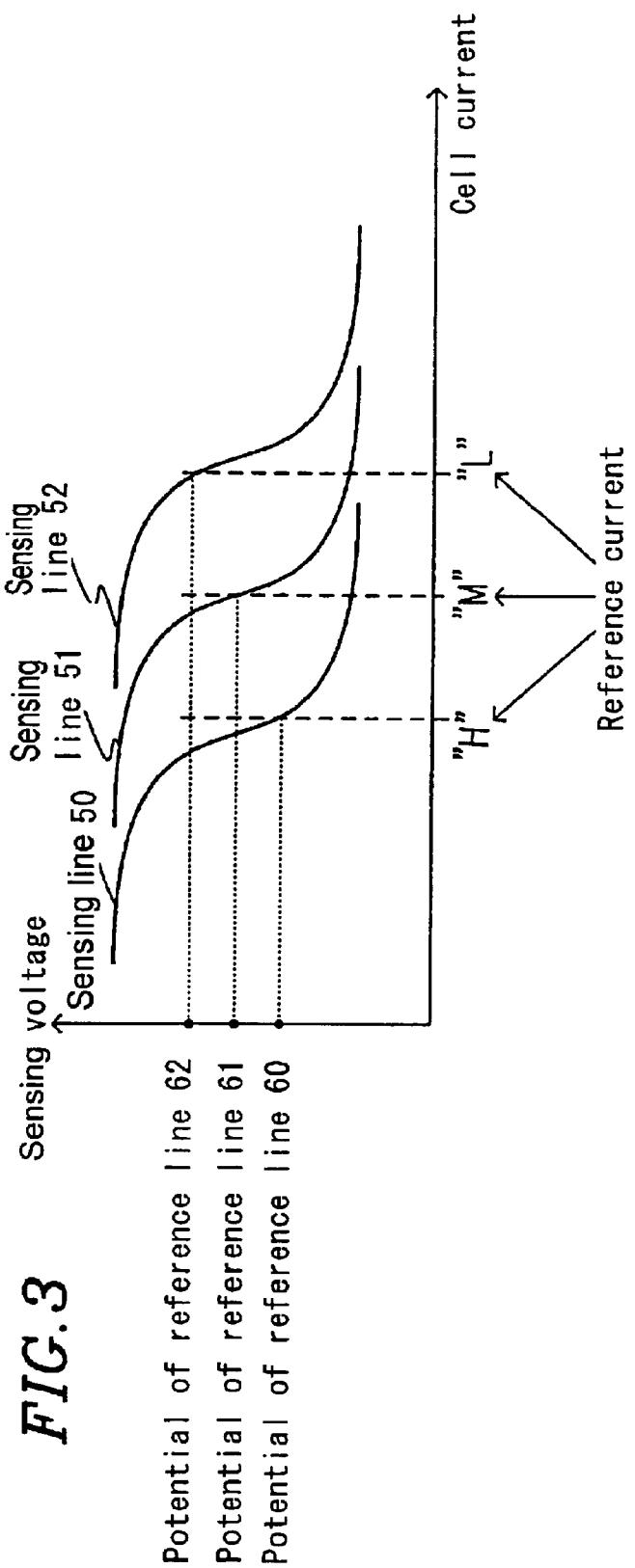
FIG. 3 is a graph illustrating an exemplary characteristic of a reading circuit according to the first example of the present invention.

FIG. 3 is a graph illustrating the relationship between the sensing voltage and the cell current level in the reading circuit 1000 shown in FIG. 1.

Notably, as the potential of the reference line is higher, the corresponding sensing voltage is lower. The reason is that as the potential of the reference line is higher, the level of the current flowing through the PMOS transistor is lower, and thus the potential of the sensing line is dropped by a smaller level.

As shown in FIG. 3, the reading-circuit 1000 has a nonlinear characteristic. Therefore, the reading operation margin can be enlarged by increasing the sensing voltage conversion efficiency in the region at and the vicinity of the points at which cell current level is equal to each of the reference current levels.

The reason why the reading circuit 1000 has a nonlinear characteristic and also performs a sensing operation in the parallel sensing system is that one reading circuit 1000 can have a plurality of operating points by supplying division cell currents to the memory cell 9 via a plurality of sensing lines.

In the above description, the division cell current flowing through the sensing line 50, the division cell current flowing through the sensing line 51, and the division cell current flowing through the sensing line 52 are joined together at a bit line and thus a cell current is formed. The present invention is not limited to this. The present invention is applicable to any structure by which division cell currents flowing through a plurality of sensing lines are joined together and a cell current flowing through one memory cell is formed.

As described above, the reading circuit 1000 performs a sensing operation by the parallel sensing system which is advantageous for increasing the reading speed while having a nonlinear characteristic which realizes a larger operation margin suitable for a multi-level memory cell. Thus, according to the first example, a reading circuit capable of high speed operation with a large operation margin which is suitable for a large multi-level memory cell is provided.

EXAMPLE 2

In the first example, no specific structure of the reference circuit was described. In a second example of the present invention, an exemplary structure of the reference circuit 110 will be described.

Figure 4:
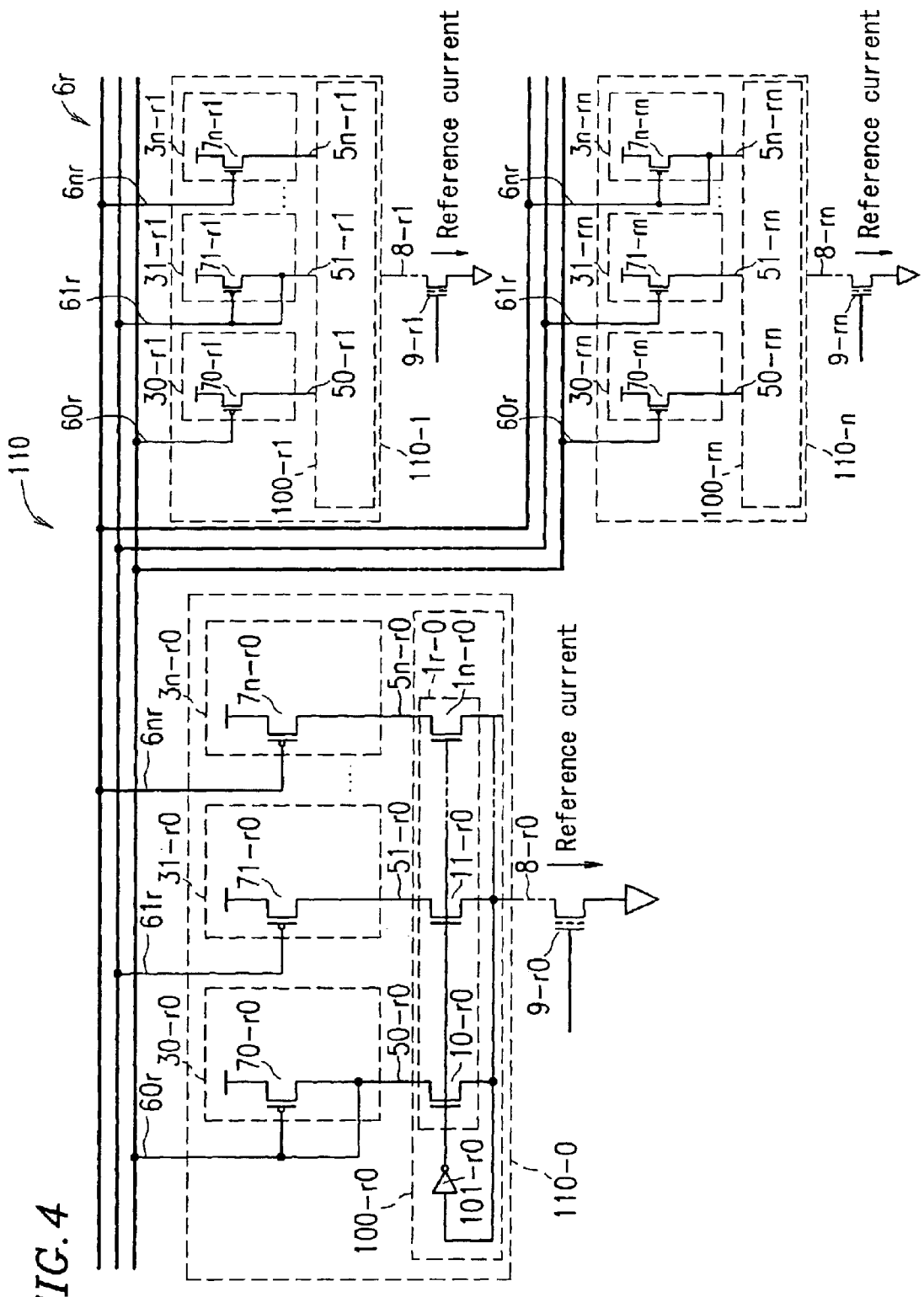
FIG. 4 is a circuit diagram illustrating a reference circuit according to a second example of the present invention.

FIG. 4 shows a circuit configuration of the reference circuit 110 shown in FIG. 1.

As shown in FIG. 4, the reference circuit 110 includes a plurality of reference voltage setting circuits 110-0 through 110-n. In the second example, the number of the reference voltage setting circuits included in the reference circuit 110 is an integer of 2 or greater.

The reference voltage setting circuit 110-0 supplies a reference current to a selected reference element 9-r0 via a reference bit line 8-r0, and converts a reference current flowing through the reference element 9-r0 into a reference voltage.

The reference voltage setting circuit 110-1 supplies a reference current to a selected reference element 9-r1 via a reference bit line 8-r1, and converts a reference current flowing through the reference element 9-r1 into a reference voltage.

In the reference circuit 110 shown in FIG. 4, "n" of the reference voltage setting circuit 110-n represents an integer of 1 or greater. In the following description, the reference circuit 110 includes at least three reference voltage setting circuits; i.e., "n" is 2 or greater.

The reference voltage setting circuits 110-0 through 110-n each include a current-voltage conversion circuit and a plurality of current load circuits.

The reference voltage setting circuit 110-0 includes a current-voltage conversion circuit 100-r0 and a plurality of current load circuits 30-r0 through 3n-r0. The current-voltage conversion circuit 100-r0 converts a division reference current flowing through a sub reference line 50-r0 into a voltage representing the potential of the sub reference line 50-r0, converts a division reference current flowing through a sub reference line 51-r0 into a voltage representing the potential of the sub reference line 51-r0, and similarly converts a division reference current flowing through a sub reference line 5n-r0 into a voltage representing the potential of the sub reference line 5n-r0.

The current-voltage conversion circuit 100-r0 includes a reference current division section 1-r0 for connecting or separating the sub reference lines 50-r0 through 5n-r0 to or from the reference cell 9-r0 via the reference bit line 8-r0, and an inverter 101-r0 for controlling the reference current division section 1-r0.

The division reference currents flowing through the sub reference lines 50-r0 through 5n-r0 are joined together so as to form a reference current flowing through the reference element 9-r0.

The reference voltage setting circuit 110-1 includes a current-voltage conversion circuit 100-r1 and a plurality of current load circuits 30-r1 through 3n-r1. The current-voltage conversion circuit 100-r1 converts a division reference current flowing through a sub reference line 50-r1 into a voltage representing the potential of the sub reference line 50-r1, converts a division reference current flowing through a sub reference line 51-r1 into a voltage representing the potential of the sub reference line 51-r1, and similarly converts a division reference current flowing through a sub reference line 5n-r1 into a voltage representing the potential of the sub reference line 5n-r1.

The division reference currents flowing through the sub reference lines 50-r1 through 5n-r1 are joined together so as to form a reference current flowing through the reference element 9-r1.

Similarly, the reference voltage setting circuit 110-n includes a current-voltage conversion circuit 100-rn and a plurality of current load circuits 30-rn through 3n-rn. The current-voltage conversion circuit 100-rn converts a division reference current flowing through a sub reference line 50-rn into a voltage representing the potential of the sub reference line 50-rn, converts a division reference current flowing through a sub reference line 51-rn into a voltage representing the potential of the sub reference line 51-rn, and similarly converts a division reference current flowing through a sub reference line 5n-rn into a voltage representing the potential of the sub reference line 5n-rn.

The division reference currents flowing through the sub reference lines 50-rn through 5n-rn are joined together so as to form a reference current flowing through the reference element 9-rn.

According to the present invention, a reference current flowing through one memory cell is formed by a plurality of division reference currents being joined together. According to the present invention, the reference current is not "divided", but the reference cell current level can be considered as being divided into levels of division reference currents respectively flowing through a plurality of sub reference lines.

FIG. 4 omits the internal structures of the current-voltage conversion circuits 100-r1 and 100-rn for the sake of simplicity. The current-voltage conversion circuits 100-r1 and 100-rn have the same structure as that of the current-voltage conversion circuit 100-r0.

As the reference elements 9-r0 through 9-rn, reference cells having the same structure and the same characteristics as those of the memory cell, whose threshold voltages are tightly adjusted, are used in order to obtain appropriate reference currents.

In this example, the reference current division section 1-r0 includes a plurality of NMOS transistors 10-r0 through 1n-r0 each having a gate and a source connected to each other via the inverter 101-r0.

The NMOS transistors 10-r0 through 1n-r0 are controlled, so that the plurality of sub reference lines 50-r0 through 5n-r0 are electrically connected to or separated from the reference bit line 8-r0, respectively. When the plurality of sub reference lines 50-r0 through 5n-r0 are electrically connected to the reference bit line 8-r0 by the NMOS transistors 10-r0 through 1n-r0, the division reference currents are joined together so as to form a reference current flowing through the reference bit line 8-r0.

A plurality of sub reference lines (50-r0 through 5n-r0) through (50-rn through 5n-rn) are respectively connected to current load circuits (30-r0 through 3n-r0) through (30-rn through 3n-rn) for supplying a division reference current to the sub reference lines (50-r0 through 5n-r0) through (50-rn through 5n-rn).

The reference voltage setting circuits 110-0 through 110-n respectively apply a reference voltage to the reference lines 60r through 6nr.

Specifically, the reference voltage setting circuit 110-0 applies a reference voltage to the reference line 60r, the reference voltage setting circuit 110-1 applies a reference voltage to the reference line 61r, and the reference voltage setting circuit 110-n applies a reference voltage to the reference line 6nr.

The reference lines 60r through 6nr are collectively referred to as a "reference line group 6r".

Specifically, in the reference voltage setting circuit 110-0, the current load circuit 30-r0 applies a reference voltage to the reference line 60r. The reference line 60r is connected to the current load circuit 30-r1 of the reference voltage setting circuit 110-1 and also to the current load circuit 30-rn of the reference voltage setting circuit 110-n. The current supply capability of each of the current load circuits 30-r1 and 30-rn is controlled by the reference voltage from the current load circuit 30-r0.

In the reference voltage setting circuit 110-1, the current load circuit 31-r1 applies a reference voltage to the reference line 61r. The reference line 61r is connected to the current load circuit 31-r0 of the reference voltage setting circuit 110-0 and also to the current load circuit 31-rn of the reference voltage setting circuit 110-n. The current supply capability of each of the current load circuits 31-r0 and 31-rn is controlled by the reference voltage from the current load circuit 31-r1.

In the reference voltage setting circuit 110-n, the current load circuit 3n-rn applies a reference voltage to the reference line 6nr. The reference line 6nr is connected to the current load circuit 3n-r0 of the reference voltage setting circuit 110-0 and also to the current load circuit 3n-r1 of the reference voltage setting circuit 110-1. The current supply capability of each of the current load circuits 3n-r0 and 3n-r1 is controlled by the reference voltage from the current load circuit 3n-rn.

As described above, the reference voltage which is output from one of the plurality of reference voltage setting circuits may control the current supply capability of at least one of the current load circuits included in the other reference voltage setting circuits.

In this example, the current load circuits (30-r0 through 3n-r0) respectively include PMOS transistors (70-r0 through 7n-r0). The current load circuits (30-r1 through 3n-r1) respectively include PMOS transistors (70-r1 through 7n-r1). The current load circuits (30-rn through 3n-rn) respectively include PMOS transistors (70-rn through 7n-rn). The PMOS transistors included in at least one current load circuit of one reference voltage setting circuit is current-mirror-connected to the PMOS transistors included in the current load circuits of the other reference voltage setting circuits.

For example, in the reference voltage setting circuit 110-0, the reference line 60r connected to an output of the PMOS transistors 70-r0 included in the current load circuit 30-r0 is connected to the gate of each of the PMOS transistors 70-r1 through 70-rn included in the current load circuits 30-r1 through 30-rn in the other reference voltage setting circuits 110-1 through 110-n so as to realize a current mirror connection. Thus, a reference voltage applied by the current load circuit 30-r0 in the reference voltage setting circuit 110-0 can control the current supply capability of each of the current load circuits 30-r1 through 30-rn.

The reference voltage applied to each of the reference lines 61r through 6nr can control the current supply capabilities of the current load circuits included in the reference voltage setting circuits other than the reference voltage setting circuit which generated the reference voltage.

For example, the reference line 61r supplied with a reference voltage by the reference voltage setting circuit 110-1 is connected to a gate of the PMOS transistor 71-r0 included in the current load circuit 31-r0 and also to a gate of the PMOS transistor 71-rn included in the current load circuit 31-rn so as to realize a current mirror connection.

The reference line 6nr supplied with a reference voltage by the reference voltage setting circuit 110-n is connected to a gate of the PMOS transistor 7n-r0 included in the current load circuit 3n-r0 and also to a gate of the PMOS transistor 7n-r1 included in the current load circuit 3n-r1 so as to realize a current mirror connection.

In addition, at least one of the PMOS transistors included in the current load circuits in each reference voltage setting circuit is also current-mirror-connected with the PMOS transistor included in the current load circuit in the division sensing circuit (FIG. 1).

For example, in the reference voltage setting circuit 110-0, the reference line 60r connected to the PMOS transistor 70-r0 included in the current load circuit 30-r0 is current-mirror-connected with a gate of the PMOS transistor 70 included in the current load circuit 30 of the division sensing circuit 20 (FIG. 1). Thus, the reference voltage of the reference line 60r can control the current supply capability of the current load circuit 30 of the division sensing circuit 20.

The reference voltage of the reference lines 61r through 6nr can also control the current supply capabilities of the current load circuits included in the division sensing circuits (FIG. 1) in substantially the same manner.

For example, the reference line 61r supplied with a reference voltage by the reference voltage setting circuit 110-1 is connected to a gate of the PMOS transistor 71-r1 included in the current load circuit 31-r1 (FIG. 4) and also to a gate of the PMOS transistor 71 included in the current load circuit 31 of the division sensing circuit 21 (FIG. 1) so as to form a current mirror connection.

The reference line 6nr supplied with a reference voltage by the reference voltage setting circuit 110-n is connected to a gate of the PMOS transistor 7n-rn included in the current load circuit 3n-rn (FIG. 4) and also to a gate of the PMOS transistor 7n included in the current load circuit 3n of the division sensing circuit 2n (FIG. 1) so as to form a current mirror connection.

Hereinafter, an operation of the reference circuit 110 in the second example will be described. In this example, data is read from a memory cell which stores 2-bit data as shown in FIG. 9A. Here, "n" in the reference numerals shown in FIG. 4 is assumed to be 2. Accordingly, the following elements will be described as bearing the following reference numerals, for example. The NMOS transistor 1n-r0 included in the reference current division section 1-r0 is 12-r0. The current load circuit 3n-r0 is 32-r0. The sub reference line 5n-r0 is 52-r0. The reference line 6nr is 62r. The PMOS transistor 7n-r0 included in the current load circuit 32-r0 is 72-r0. The reference bit line 8-rn is 8-r2. The reference element 9-rn is 9-r2.

For reading data from a memory cell which can store m-bit data (m is an integer of 2 or greater), n is set as $2^m-1$.

In the following description, it is assumed that the reference line group 6 in the reading circuit 1000 shown in FIG. 1 is the same as the reference line group 6r in the reference circuit 110 shown in FIG. 4, and that the reference lines 60 through 62 are the same as the reference lines 60r through 62r. The reference line group will be represented by reference numeral "6", and the reference lines will be represented by reference numerals 60 through 62.

It is also assumed that the reference current level "H" between the fourth state (FIG. 9A) (corresponding to data "00") and the third state (corresponding to data "01") is obtained by the reference element 9-r0, reference current level "M" between the third state (corresponding to data "01") and the second state (corresponding to data "10") is obtained by the reference element 9-r1, and reference current level "L" between the second state (corresponding to data "10") and the first state (corresponding to data "11") is obtained by the reference element 9-r2.

It is assumed that the PMOS transistors 70-r0 through 72-r0, 70-r1 through 72-r1, and 70-r2 through 72-r2 have the same transistor size, and the NMOS transistors 10-r0 through 12-r0, 10-r1 through 12-r1, and 10-r2 through 12-r2 also have the same transistor size. (The NMOS transistors 10-r1 through 12-r1 and 10-r2 through 12-r2 are omitted from FIG. 4 for the sake of simplicity.)

When an appropriate voltage is applied to gates of selected reference elements 9-r0 through 9-r2 in the reference current setting circuits 110-0 through 110-2, the potentials of the reference bit lines 8-r0 through 8-r2 are decreased. Thus, the potentials of the outputs from the inverters 101-r0 through 101-r2 included in the current-voltage conversion circuits 100-r0 through 100-r2 are increased. As a result, the NMOS transistors (10-r0 through 12-r0) through (10-r2 through 12-r2) included in the reference current division section 1-r0 through 1-r2 each become conductive.

Then, the potentials of the sub reference lines (50-r0 through 52-r0) through (50-r2 through 52-r2) are decreased in accordance with the potentials of the reference bit lines 8-r0 through 8-r2. Then, a sufficient potential difference is generated between the source and the drain of each of the PMOS transistors (70-r0 through 72-r0) through (70-r2 through 72-r2) included in the current load circuits (30-r0 through 32-r0) through (30-r2 through 32-r2).

Thus, the PMOS transistors 70-r0, 71-r1 and 72-r2, in each of which the gate and the drain are connected to each other, become conductive. As a result, the PMOS transistors 70-r1, 70-r2, 71-r0, 71-r2, 72-r0, and 72-r1 connected to the reference lines 60r, 61r and 62r also become conductive. Thus, the reference bit lines 8-r0 through 8-r2 are charged via the sub reference lines (50-r0 through 52-r0) through (50-r2 through 52-r2) and the NMOS transistors (10-r0 through 12-r0) through (10-r2 through 12-r2). When the potentials of the bit lines 8-r0 through 8-r2 are increased, a potential difference is generated between the drain and the source of each of the reference elements 9-r0 through 9-r2. Thus, a reference current flows.

When the reference bit lines 8-r0 through 8-r2 are charged to a prescribed potential, the potentials of the outputs from the inverters 101-r0 through 101-r2 included in the current-voltage conversion circuits 100-r0 through 100-r2 are decreased. Thus, the current supply capability of each of the NMOS transistors (10-r0 through 12-r0) through (10-r2 through 12-r2) are reduced.

When the potentials of the reference bit lines 8-r0 through 8-r2, the levels of the reference currents flowing through the reference elements 9-r0 through 9-r2, and the levels of the currents flowing through the NMOS transistors (10-r0 through 12-r0) through (10-r2 through 12-r2) reach an equilibrium state, the potentials and the levels of the currents in the reference circuit 110 are stabilized.

The reference element 9-r0 is set so as to obtain the reference current level "H" between data "00" and data "01" (FIG. 9A), the reference element 9-r1 is set so as to obtain the reference current level "M" between data "01" and data "10", and reference element 9-r2 is set so as to obtain the reference current level "L" between data "10" and data "11". Thus, the potentials of the reference lines 60r, 61r and 62r are set to be relatively high, medium and low, respectively.

The PMOS transistor 70 of the division sensing circuit 20 in FIG. 1 and the PMOS transistor 70-r0 of the reference voltage setting circuit 110-0 are current-mirror-connected to each other. The division sensing circuit 20 is supplied with a reference voltage which is output from the reference voltage setting circuit 110-0 (the potential of the reference line 60r in FIG. 4).

The reference voltage setting circuit 110-0 includes three current load circuits 30-r0 through 32-r0. The current load circuits, excluding the current load circuit 30-r0 which actively operates in order to determine the reference voltage, i.e., the current load circuits 31-r0 and 32-r0 are connected as follows. The current load circuit 31-r0 is connected to the reference line 61, which is in turn connected to the current load circuit 31-r1 which actively operates in order to determine the potential of the reference line 61. The current load circuit 32-r0 is connected to the reference line 62, which is in turn connected to the current load circuit 32-r2 which actively operates in order to determine the potential of the reference line 62. Thus, the current supply capability of each of the current load circuit 31-r0 and current load circuit 32-r0 is controlled.

Similarly, the current load circuits 31 and 32 respectively included in the division sensing circuits 21 and 22 (FIG. 1) are also supplied with reference voltages via the reference lines 61 and 62.

Thus, the current load circuit 31 of the division sensing circuit 21 shown in FIG. 1 and the current load circuit 31-r0 of the reference voltage setting circuit 110-0 shown in FIG. 4 are both controlled in terms of the current supply capability by the reference line 61. Similarly, the current load circuit 32 of the division sensing circuit 22 shown in FIG. 1 and the current load circuit 32-r0 of the reference voltage setting circuit 110-0 shown in FIG. 4 are both controlled in terms of the current supply capability by the reference line 62.

Therefore, the cell current flowing through the memory cell 9 and the reference current flowing through the reference element 9-r0 are influenced in substantially the same manner. Especially when the cell current level and the reference current level are equal to each other, the cell current and the reference current are influenced in exactly the same manner.

Such an influence is cancelled from the reading circuit 1000 and the reference circuit 110. Then, the PMOS transistor 70 included in the current load circuit 30 is current-mirror-connected with the PMOS transistor 70-r0 included in the current load circuit 30-r0 as shown in FIG. 15A and shows a nonlinear load characteristic as shown in FIG. 15B, which provides a larger operation margin.

Therefore, the sense amplifier 40 in the division sensing circuit 20 can determine whether the cell current level is on the side of data "00" or on the side of data "01" with respect to the border between data "00" and data "01". This determination is performed based on the reference voltage generated by the reference element 9-r0 which is set to the reference current level "H".

Similarly, the sense amplifier 41 in the division sensing circuit 21 can determine whether the cell current level is on the side of data "01" or on the side of data "10" with respect to the border between data "01" and data "10". This determination is performed based on the reference voltage generated by the reference element 9-r1 which is set to the reference current level "M". The sense amplifier 42 in the division sensing circuit 22 can determine whether the cell current level is on the side of data "10" or on the side of data "11" with respect to the border between data "10" and data "11". This determination is performed based on the reference voltage generated by the reference element 9-r2 which is set to the reference current level "L".

As described above, the reference circuit in this example easily generates a reference voltage required for the reading circuit 1000 shown in FIG. 1, and also allows the transistors included in the reading circuit 1000 and the reference circuit 110 to have the same layout pattern. Therefore, circuits having the same transistor characteristics can be easily produced.

Thus, the reference circuit in this example relatively easily allows for variance in the transistor characteristics caused during the production process, and is suitable for multi-level memory cells.

EXAMPLE 3

In a third example of the present invention, a semiconductor memory device including two reference circuits will be described.

Figure 5:
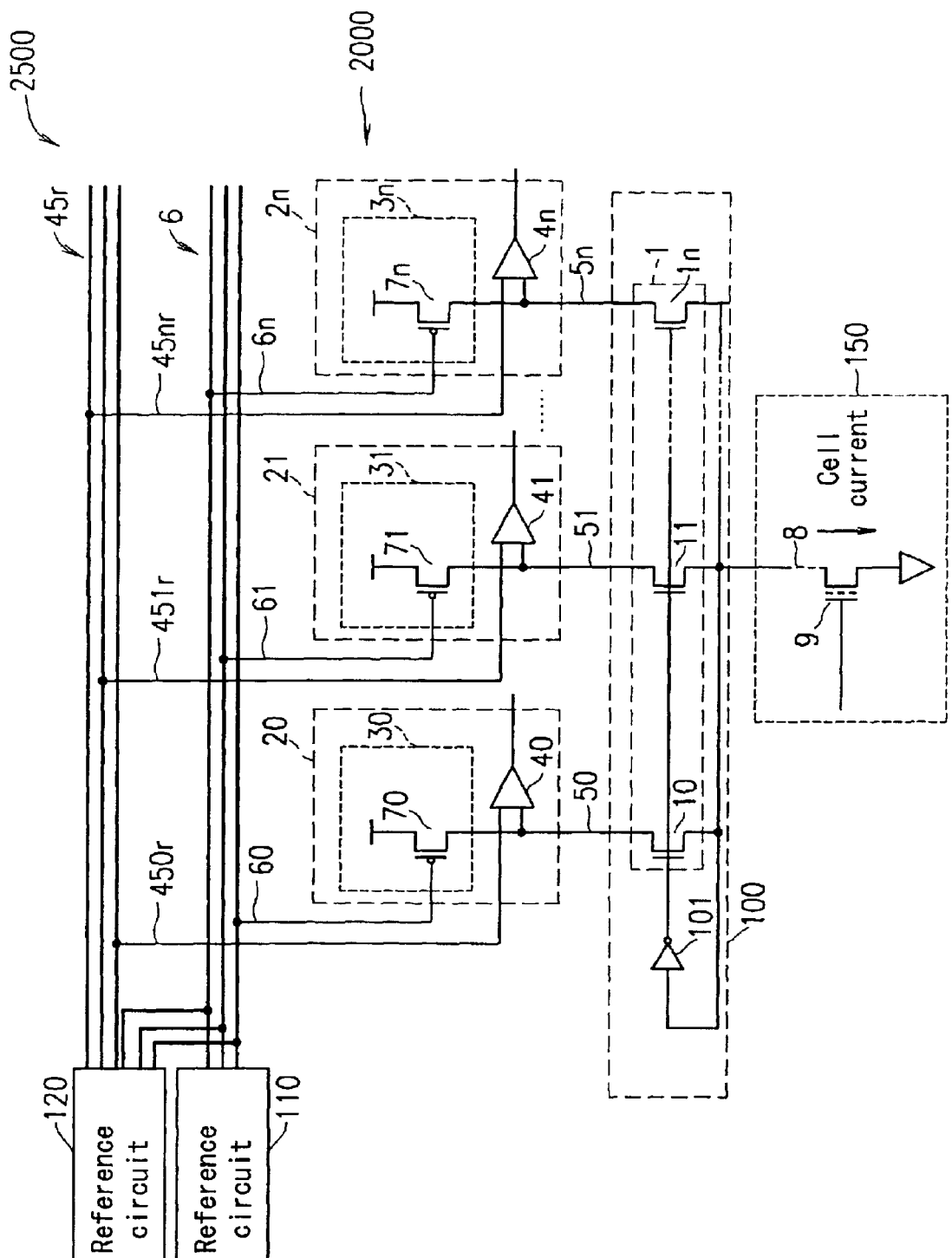
FIG. 5 is a circuit diagram illustrating a semiconductor memory device according to a third example of the present invention.

FIG. 5 schematically shows a structure of a semiconductor memory device 2500 according to the third example of the present invention.

The semiconductor memory device 2500 includes a memory cell array 150 including a plurality of memory cells, a reading circuit 2000 for reading data from one of the plurality of memory cells, and reference circuits 110 and 120 for generating a reference voltage used for reading data.

In the following description, elements having substantially the same functions as those in the first and second examples bear the same reference numerals, and the same functions will not be described.

The reading circuit 2000 includes a plurality of division sensing circuits 20 through 2n and a current-voltage conversion circuit 100.

The division sensing circuits 20 through 2n are each supplied with two types of reference voltages from the two reference circuits (reference circuits 110 and 120).

Sense amplifiers 40 through 4n are each supplied with one type of reference voltage from the reference circuit 120 via a first reference line group 5 (including reference lines 50n through 5nr).

Current load circuits 30 through 3n are each supplied with another type of reference voltage from the reference circuit 110 via a second reference line group 6 (including reference lines 60 through 6n) for controlling the current supply capability of each of the current load circuits 30 through 3n.

The reference circuits 110 and 120 may act as one reference circuit.

The reference circuits 110 and 120 are not included in the reading circuit 2000 in FIG. 5. The present invention is not limited to such a structure. The reading circuit 2000 may include the reference circuits 110 and 120.

Figure 6:
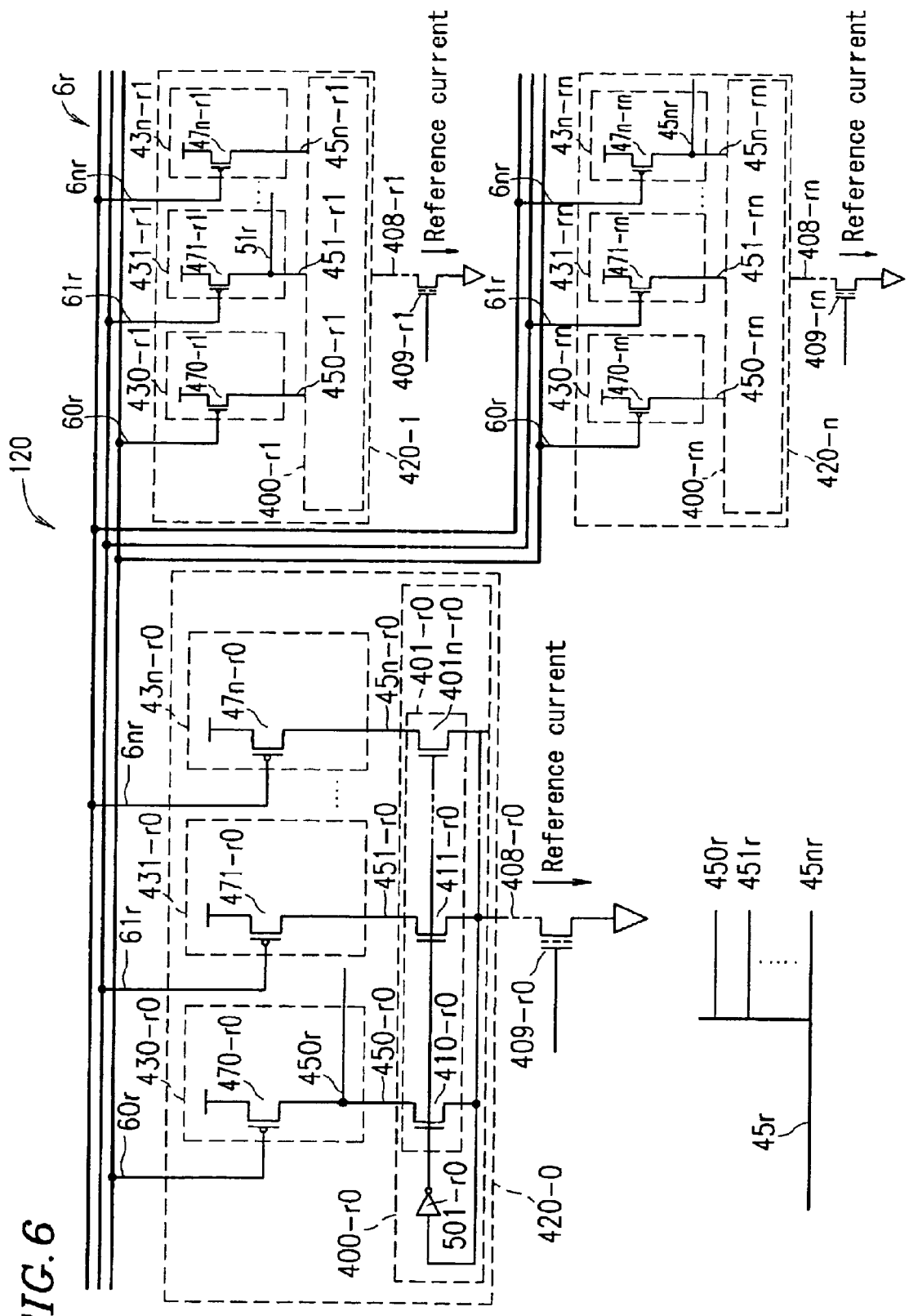
FIG. 6 is a circuit diagram illustrating a reference circuit according to the third example of the present invention.

FIG. 6 is a partial circuit diagram of the reference circuit 120 shown in FIG. 5.

As shown in FIG. 6, the reference circuit 120 includes a plurality of reference voltage setting circuits 420-0 through 420-n. The reference voltage setting circuits 420-0 through 420-n supply reference currents to selected reference elements 409-r0 through 409-rn (among a plurality of reference elements) via reference bit lines 408-r0 through 408-rn and thus convert the reference currents flowing through the reference elements 409-r0 through 409-rn into reference voltages, respectively.

As the reference elements 409-r0 through 409-rn, reference cells having the same structure and the same characteristics as those of the memory cell, whose threshold voltages are tightly adjusted, are used in order to obtain appropriate reference currents.

The reference voltage setting circuits 420-0 through 420-n respectively include current-voltage conversion circuits 400-r0 through 400-rn and a plurality of current load circuits 430-r0 through 43n-r0, 430-r1 through 43n-r1, and 430-rn through 43n-rn.

FIG. 6 does not show the internal structure of the current-voltage conversion circuits 400-r1 through 400-rn for the sake of simplicity. The current-voltage conversion circuits 400-r1 through 400-rn have the same internal structure as that of the current-voltage conversion circuit 400-r0.

The current-voltage conversion circuits 400-r0 through 400-rn include reference current division sections 401-r0 through 401-rn for connecting or separating the sub reference lines 450-r0 through 45n-r0, 450-r1 through 45n-r1 and 450-rn through 45n-rn to or from the reference cells 409-r0 through 409-rn via the reference bit lines 408-r0 through 408-rn, and also include inverters 501-r0 through 501-rn for controlling the reference current division sections 401-r0 through 401-rn.

In this example, the reference current division sections 401-r0 through 401-rn respectively include a plurality of NMOS transistors (410-r0 through 41n-r0) through (410-rn through 41n-rn ) having a gate and a source connected to each other via the inverters 501-r0 through 501-rn. The plurality of sub reference lines (450-r0 through 45n-rn) through (450-rn through 45n-rn) are electrically connected to or separated from the reference bit lines 408-r0 through 408-rn by the NMOS transistors (410-r0 through 41n-r0) through (410-rn through 41n-rn), respectively. When these elements are electrically connected, the division reference currents are joined together to form reference currents and are supplied to the reference bit lines 408-r0 through 408-rn, respectively.

The plurality of sub reference lines (450-r0 through 45n-r0) through (450-rn through 45n-rn) are respectively connected to the current load circuits (430-r0 through 43n-r0) through (430-rn through 43n-rn), and thus are supplied with the division reference currents.

The reference voltage setting circuits 420-0 through 420-n respectively apply a reference voltage to the reference lines 450r through 45nr.

The difference between the reference circuits 110 and 120 is as follows.

In the reference circuit 110, a reference voltage which is output from the reference voltage setting circuit is current-mirror-connected with at least one of the current load circuits included in the other reference voltage setting circuits. Thus, the at least one of the current load circuits included in the other reference voltage setting circuits is controlled. In the reference circuit 120, the reference voltages are output via the reference lines 450r through 45nr. The reference lines 450r through 45nr will be collectively referred to as a "reference line group 45r". The reference line group 45r is schematically shown in a right bottom portion of FIG. 6.

In the reference circuit 120, the reference voltage setting circuits 420-0 through 420-n are controlled in terms of the current supply capability by the reference voltages which are applied by the reference circuit 110 via the reference lines 60r through 6nr.

In this example, the current load circuits (430-r0 through 43n-r0) through (430-rn through 43n-rn) respectively include PMOS transistors (470-r0 through 47n-r0) through (470-rn through 47n-rn). The PMOS transistors included in at least one of the current load circuits of the reference voltage setting circuits included in the reference circuit 110 are current-mirror-connected with PMOS transistors included in the current load circuits of the reference voltage setting circuits of the reference circuit 120.

For example, the reference line 60r which is connected to the PMOS transistor 70-r0 included in the current load circuit 30-r0 of the reference voltage setting circuit 110-0 of the reference circuit 110 is current-mirror-connected to gates of the PMOS transistors 470-r0 through 470-rn included in the current load circuits 430-r0 through 430-rn in the reference voltage setting circuits 420-0 through 420-n of the reference circuit 120. Thus, the current supply capability of each of the current load circuit 430-r0 through 430-rn can be controlled.

Similarly, the potentials of the reference lines 6 Ir through 6nr which are connected to the reference circuit 110 respectively control the current supply capabilities of the current load circuits included in the reference voltage setting circuits 420-0 through 420-n of the reference circuit 120.

Hereinafter, an operation of the reference circuit 120 having the above-described structure will be described. In this example, data is read from a memory cell which stores 2-bit data as shown in FIG. 9A.

Here, "n" in the reference numerals shown in FIG. 6 is assumed to be 2. Accordingly, for example, the following elements will be described as bearing the following reference numerals. The NMOS transistor 41n-r0 included in the reference current division section 401-r0 is 412-r0. The current load circuit 43n-r0 is 432-r0. The sub reference line 45n-r0 is 452-r0. The reference line 45nr is 452r. The reference line 46nr is 462r. The PMOS transistor 47n-r0 included in the current load circuit 432-r0 is 472-r0. The reference bit line 408-rn is 408-r2. The reference element 409-rn is 409-r2.

For reading data from a memory cell which can store m-bit data (m is an integer of 2 or greater), n is set as $2^m-1$.

It is also assumed that the reference current level "H" between the fourth state (FIG. 9A) (corresponding to data "00") and the third state (corresponding to data "01") is obtained by the reference element 409-r0, reference current level "M" between the third state (corresponding to data "01") and the second state (corresponding to data "10") is obtained by the reference element 409-r1, and reference current level "L" between the second state (corresponding to data "10") and the first state (corresponding to data "11") is obtained by the reference element 409-r2. Thus, the potentials of the reference lines 450r through 452r included in the reference line group 45r respectively become equal to the potentials of the reference lines 60 through 62 included in the reference line group 6.

It is assumed that in the reference circuit 120, the PMOS transistors 470-r0 through 472-r0, 470-r1 through 472-r1, and 470-r2 through 472-r2 have the same transistor size, and the NMOS transistors 410-r0 through 412-r0, 410-r1 through 412-r1, and 410-r2 through 412-r2 also have the same transistor size. (The NMOS transistors 410-r1 through 412-r1 and 410-r2 through 412-r2 are omitted from FIG. 6 for the sake of simplicity.)

When an appropriate voltage is applied to gates of selected reference elements 409-r0 through 409-r2 in the reference current setting circuits 120-0 through 120-2, the potentials of the reference bit lines 408-r0 through 408-r2 are decreased. Thus, the potentials of the outputs from the inverters 501-r0 through 501-r2 included in the current-voltage conversion circuits 400-r0 through 400-r2 are increased. As a result, the NMOS transistors (410-r0 through 412-r0) through (410-r2 through 412-r2) included in the reference current division section 401-r0 through 401-r2 each become conductive.

Then, the potentials of the sub reference lines (450-r0 through 452-r0) through (450-r2 through 452-r2) are decreased in accordance with the potentials of the reference bit lines 408-r0 through 408-r2. Then, a sufficient potential difference is generated between the source and the drain of each of the PMOS transistors (470-r0 through 472-r0) through (470-r2 through 472-r2) included in the current load circuits (430-r0 through 432-r0) through (430-r2 through 432-r2).

Thus, the PMOS transistors 70-r0, 71-r1 and 72-r2 included in the reference circuit 110 and operating in substantially the same manner become conductive. As a result, the PMOS transistors (470-r0 through 472-r0) through (470-r2 through 472-r2) respectively connected to the PMOS transistors 70-r0, 71-r1 and 72-r2 also become conductive. Thus, the reference bit lines 408-r0 through 408-r2 are charged via the sub reference lines (450-r0 through 452-r0) through (450-r2 through 452-r2) and the NMOS transistors (410-r0 through 412-r0) through (410-r2 through 412-r2). When the potentials of the reference bit lines 408-r0 through 408-r2 are increased, a potential difference is generated between the drain and the source of each of the reference elements 409-r0 through 409-r2. Thus, a reference current flows.

When the reference bit lines 408-r0 through 408-r2 are charged to a prescribed potential, the potentials of the outputs from the inverters 501-r0 through 501-r2 included in the current-voltage conversion circuits 400-r0 through 400-r2 are decreased. Thus, the current supply capability of each of the NMOS transistors (410-r0 through 412-r0) through (410-r2 through 412-r2) is reduced.

When the potentials of the reference bit lines 408-r0 through 408-r2, the levels of the reference currents flowing through the reference elements 409-r0 through 409-r2, and the levels of the currents flowing through the NMOS transistors (410-r0 through 412-r0) through (410-r2 through 412-r2) reach an equilibrium state, the potentials and the levels of the currents in the reference circuit 120 are stabilized.

The reference element 409-r0 is set so as to obtain the reference current level "H" between data "00" and data "01" (FIG. 9A), the reference element 409-r1 is set so as to obtain the reference current level "M" between data "01" and data "10", and reference element 409-r2 is set so as to obtain the reference current level "L" between data "10" and data "11". Thus, the potentials of the reference lines 50r, 51r and 52r are set to be relatively high, medium and low, respectively.

The division sensing circuits 20 through 22 shown in FIG. 5 are supplied with reference voltages via the reference lines 450r through 452r which are connected to the reference voltages setting circuits 420-0 through 420-2 of the reference circuit 120. The sense amplifier 40 in the division sensing circuit 20 determines whether the cell current level is on the side of data "00" or on the side of "01" with respect to the border between data "00" and data "01". This determination is performed by comparing the potential of the reference line 450r generated by the reference element 409-r0 set to the reference current level "H" in the reference circuit 120 with the potential of the sensing line 50.

Similarly, the sense amplifier 41 in the division sensing circuit 21 determines whether the cell current level is on the side of data "01" or on the side of data "10" with respect to the border between data "01" and data "10". This determination is performed by comparing the potential of the reference line 451r generated by the reference element 409-r1 set to the reference current level "M" in the reference circuit 120 with the potential of the sensing line 51. The sense amplifier 42 in the division sensing circuit 22 determines whether the cell current level is on the side of data "10" or on the side of data "11" with respect to the border between data "10" and data "11". This determination is performed by comparing the potential of the reference line 452r generated by the reference element 409-r2 set to the reference current level "L" in the reference circuit 120 with the potential of the sensing line 52.

As described above, in the reading circuit 2000 in this example, the reference line group 45r and the reference line group 6 are separated from each other. This structure provides the following effects.

In the reading circuit 1000 in FIG. 1, the reference line 60 and the sensing line 50 are connected to the inputs of the sense amplifier 40. The reference line 60 has a gate capacitance and a drain capacitance of the PMOS transistors 70-r0 included in the reference circuit 110, a line capacitance of the sub reference line 50-r0, a gate capacitance of the PMOS transistor 70, and an input terminal capacitance of the sense amplifier, and the like.

The sensing line 50 has a line capacitance of the sensing line 50, an input terminal capacitance of the sense amplifier, and the like.

Accordingly, the capacitance of the reference line 60 is often larger than the capacitance of the sensing line 50. The capacitance difference between the reference line 60 and the sensing line 50 may generate a difference in, for example, the swing generated when noise is transmitted to the power supply, during the time period until both the reference voltage and the sensing voltage are electrically stabilized. The same is true with the other sense amplifiers 41 through 4n. This is considered to significantly influence the time required for reading data from memory cells using the reading circuit 1000.

By contrast, in the reading circuit 2000 in the third example, the reference lines 60 through 6n for controlling the current supply capabilities of the current load circuits can be separated from the reference lines 450r through 45nr which are input to the sense amplifiers 40 through 4n. Therefore, the capacitance difference between the signals at both ends of the sense amplifiers 40 through 4n, and thus the above-described influence caused by the noise or the like, can be minimized. This enlarges the reading operation margin. The reading circuit 2000 is more suitable for multi-level memory cells.

EXAMPLE 4

In the first through third examples, the NMOS transistors 10 through in included in the cell current division section 1 are set to have the same transistor size and also to have the same gate potential. Therefore, the NMOS transistors 10 through 1n have an equal current supply capability.

Similarly, in the first through third examples, NMOS transistors (10-r0 through 1n-r0) through (10-rn through 1n-rn) included in the reference current division sections 1-r0 through 1-rn are set to have the same transistor size and also to have the same gate potential. Therefore, the NMOS transistors (10-r0 through 1n-r0) through (10-rn through 1n-rn) have an equal current supply capability.

The present invention is not limited to such an embodiment.

In a fourth example of the present invention, the current supply capability of each of the NMOS transistors is optimized so as to further enlarge the operation margin.

A reading circuit and a reference circuit in the fourth example are different from those of the first through third examples in the points described below with reference to FIGS. 4, 7 and 8.

In this example also, a circuit configuration for reading data from a multi-level memory cell which can store a plurality of bits of data as shown in FIG. 9A will be described. "n" in the reference numerals in the figures referred in this example is assumed to be 2.

In this example, a cell current division section of the reading circuit includes NMOS transistors 10 through 12 having different transistor sizes.

The current supply capability of each of the NMOS transistors 10-r0 through 12-r0, 10-r1 through 12-r1, and 10-r2 through 12-r2 included in the reference circuit 110 is set in substantially the same manner as that of the corresponding NMOS transistor.

As described above, the potentials of the reference lines 60 through 62 have the relationship of the reference line 60>the reference line 61>the reference line 62. The current supply capabilities of the current load circuits 30 through 32 have the relationship of the current load circuit 30<the current load circuit 31<current load circuit 32.

The reason why the above-mentioned relationships are realized is that the voltage applied to the reference line 60 corresponds to the reference current level "H", and the voltage applied to the reference line 62 corresponds to the reference current level "L" which is a larger amount of current.

Before describing the embodiment in which the NMOS transistors 10 through 12 have different current supply capabilities, an embodiment in which the NMOS transistors 10 through 12 have the same current supply capability will be first described.

Figure 7:
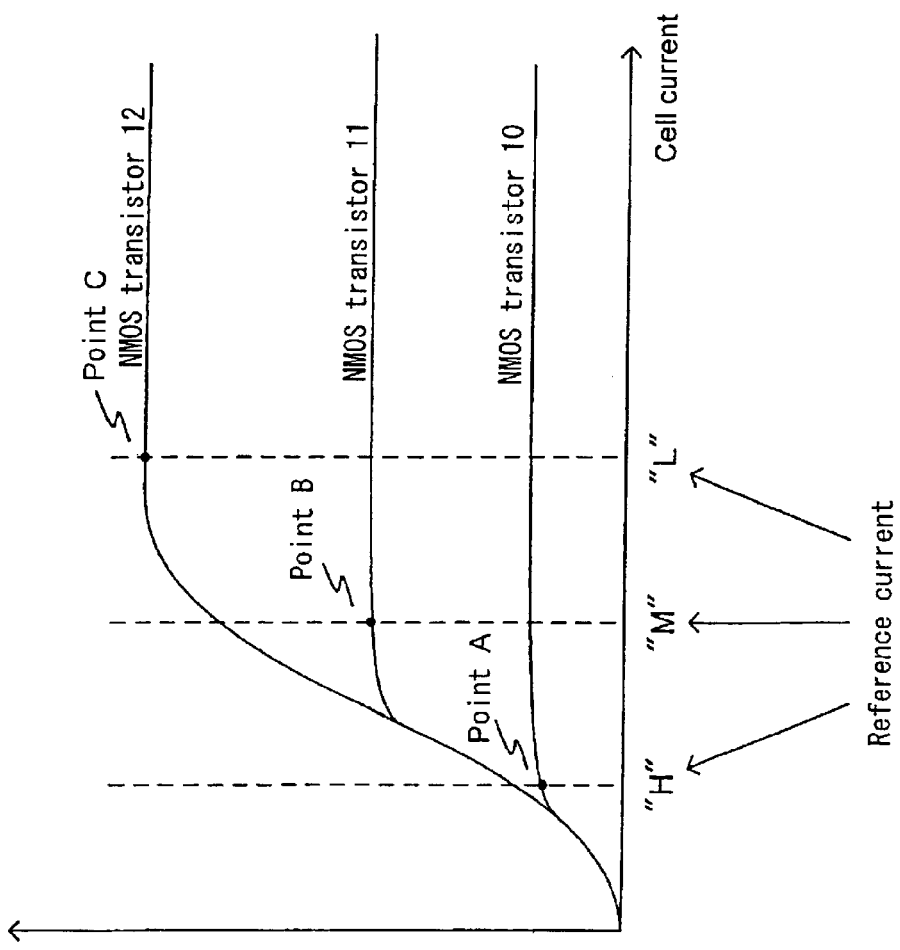
FIG. 7 is a graph illustrating an exemplary characteristic of a cell current division section of the reading circuit according to the first example of the present invention.

FIG. 7 is a graph illustrating the relationship between the cell current and the source-drain current of each of the NMOS transistors 10 through 12 in the case where the NMOS transistors 10 through 12 have the same current supply capability (i.e., the same transistor size).

The cell current is obtained by combining division cell currents flowing through the NMOS transistors 10 through 12. Therefore, the total of the source-drain current levels is equal to the cell current level.

When the cell current level is in the vicinity of the reference current level "L", the division cell current flowing through the NMOS transistor 12 has the highest contribution ratio to the cell current (point C). This is caused since the current load circuits 30 through 32 have different current supply capabilities. As shown in FIG. 7, the NMOS transistors 10 and 11 cannot supply a level of current which is higher than the level of current from the current load circuit thereof. Therefore, the current flowing through the NMOS transistor 12, supplied with the highest level of current among the three NMOS transistors 10 through 12, contributes most to the cell current.

In this case, the current flowing through each of the PMOS transistors 70 through 72 included in the current load circuits 30 through 32 is limited. Therefore, the NMOS transistors 10 through 12 have substantially no influence on the potentials of the sensing lines 50 through 52.

When the cell current level is in the vicinity of the reference current level "H" (point A), the source-drain currents of the NMOS transistors 10 through 12 have substantially the same level. The reason is considered to be as follows.

Although the current load circuit 30 through 32 have different current supply capabilities, the cell current level is low and thus the division cell currents are not much limited by the PMOS transistors 70 through 72 included in the current load circuit 30 through 32. Accordingly, the potentials of the sensing lines 50 through 52 drop only slightly, and thus are high.

As a result, a large potential difference is generated between the source and the drain of each of the NMOS transistors 10 through 12, and the NMOS transistors 10 through 12 operate in a saturation region (a pentode region) and saturate at substantially the same level of current. Therefore, the division cell currents flowing through the NMOS transistors 10 through 12 have substantially the same level, and the cell current level is about 3 times the level of one division cell current.

As described above, whether the cell current level is higher or lower than the reference current level "L" is determined by the sense amplifier 42 connected to the drain of the NMOS transistor 12. Whether the cell current level is higher or lower than the reference current level "H" is determined by the sense amplifier 40 connected to the drain of the NMOS transistor 10.

When the cell current level is high (point C in FIG. 7), the division sensing circuit 22, for determining whether the cell current level is higher or lower than the reference current level "L", contributes most to the cell current. When the cell current level is low (point A in FIG. 7), the contribution of each division cell circuit to the cell current is only ⅓.

As a result, the relative operation margin is different when the cell current is in the vicinity of the reference current level "L" from when the cell current is in the vicinity of the reference current level "H".

Therefore, in order to realize the state where the division sensing circuit, for determining whether the cell current level is higher or lower than the corresponding reference current level, contributes most to the cell current even when the cell current level is low, the current supply capability of each NMOS transistor included in the cell current division section 1 is set as follows. The current supply capability of each of the NMOS transistors 10 through 12 is set so as to be lower as the current supply capability of the corresponding one of the current load circuits 30 through 32 is higher, and so as to be higher as the current supply capability of the corresponding one of the current load circuits 30 through 32 is lower.

In this example, the current supply capabilities of the current load circuits 30 through 32 have the relationship of the current load circuit 30<the current load circuit 31<the current load circuit 32. Therefore, the current supply capabilities of the NMOS transistors 10 through 12 are set so as to have the relationship of the NMOS transistor 10>the NMOS transistor 11>the NMOS transistor 12.

The current supply capabilities of the NMOS transistors included in the reference circuit 110 are also set to have the relationship of the NMOS transistors 10-r0 through 10-r2>the NMOS transistors 11-r0 through 11-r2>the NMOS transistors 12-r0 through 12-r2.

Figure 8:
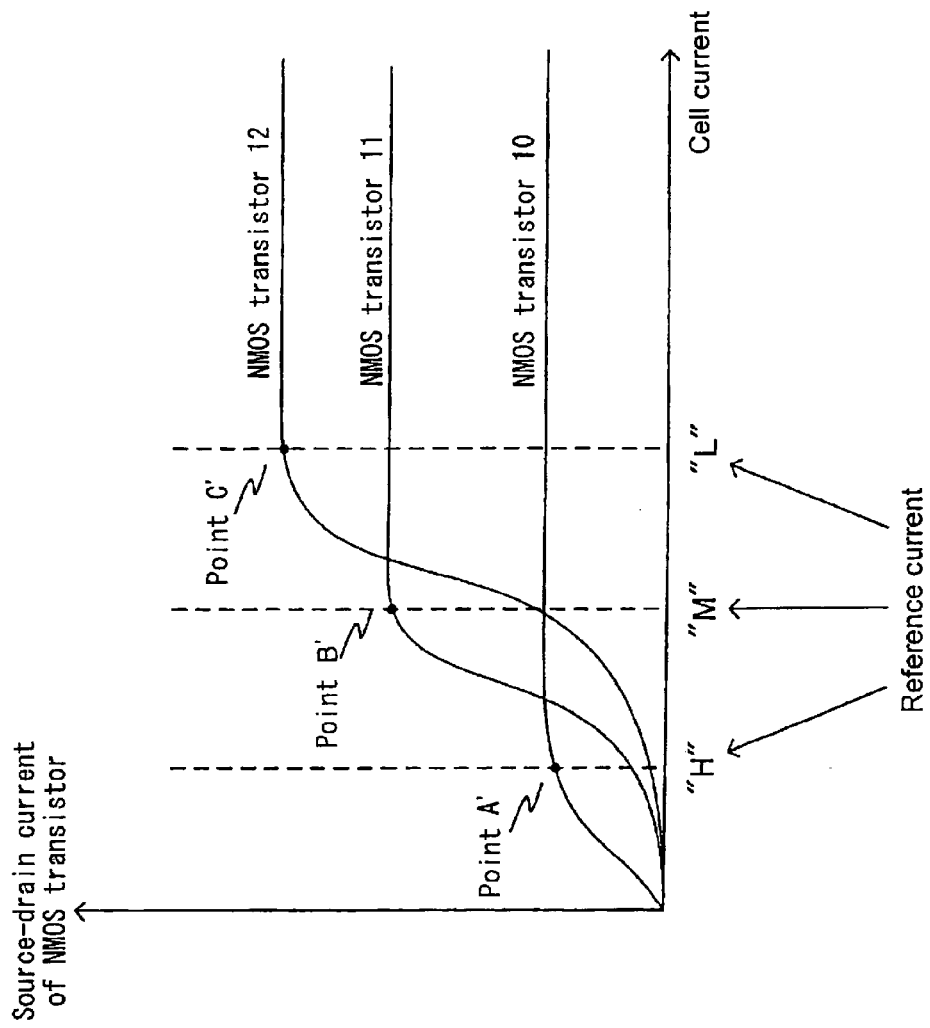
FIG. 8 is a graph illustrating an exemplary characteristic of a cell current division section of the reading circuit according to a fourth example of the present invention.

FIG. 8 is a graph illustrating the relationship between the cell current and the source-drain current of each of the NMOS transistors 10 through 12 in the case where the current supply capabilities of the NMOS transistors 10 through 12 have the relationship of the NMOS transistor 10>the NMOS transistor 11>the NMOS transistor 12.

When the cell current level is high, the cell current level is limited by the current supply capabilities of the current load circuits 30 through 32. Therefore, the operation of the reading circuit and the reference circuit are substantially the same as that in the case of FIG. 7.

When the cell current level is low, the NMOS transistors 10 through 12 are saturated at different current levels even when the NMOS transistors 10 through 12 operate in the saturation region. This occurs because the NMOS transistors 10 through 12 have different current supply capabilities.

For example, the current supply capability levels of the NMOS transistors 10 through 12 are set at 3:2:1. When the cell current level is in the vicinity of the reference current "H" (point A'), the contribution, to the cell current, of the division cell current flowing through the NMOS transistor 10 connected to the division sensing circuit 20 is $3/6$. The contribution, to the cell current, of the division cell current flowing through the NMOS transistor 11 connected to the division sensing circuit 21 is $2/6$. The contribution, to the cell current, of the division cell current flowing through the NMOS transistor 12 connected to the division sensing circuit 22 is $1/6$.

Thus, even when the cell current level is low, the division sensing circuit 20, for determining whether the cell current level is higher or lower than the reference current level "H", can contribute most to the cell current. As a result, the difference in relative operation margin which is caused by the level of the cell current can be minimized, which realizes a reading circuit capable of higher speed operation and higher reading precision.

In the fourth example of the present invention, the current supply capabilities of the NMOS transistors 10 through 12 are described. More specifically, the current supply capabilities of the NMOS transistors may be adjusted in accordance with the transistor size, the gate potential, or both.

As described above, a reading circuit according to the present invention realizes both (i) a parallel sensing system which is advantageous for a higher speed reading operation and (ii) nonlinear load characteristics which provide a larger operation margin. Therefore, the reading circuit according to the present invention is suitable for multi-level memory cells.

A reference circuit according to the present invention can easily generate a reference voltage required for a reading circuit of the present invention and allows a plurality of transistors included in the reading circuit and the reference circuit to have an equivalent layout pattern. Therefore, the reference circuit easily allows for variance in the transistor characteristics caused during the production process, and is suitable for multi-level memory cells.

In an embodiment in which the cell current division section and the reference current division section each have a plurality of NMOS transistors and the current supply capability of each of the NMOS transistors is optimized, the difference in relative operation margin which is caused by the cell current level can be minimized. Therefore, a reading circuit capable of performing a higher speed operation and having higher reading precision is provided.

A semiconductor memory device including a reading circuit and/or a reference circuit according to the present invention can perform a higher speed operation and has a larger operation margin and higher reading precision.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A reading circuit for reading data from one memory cell of a plurality of memory cells, the reading circuit comprising:

a plurality of division sensing circuits each connected to the one memory cell via a sensing line corresponding thereto among a plurality of sensing lines; and a current-voltage conversion circuit for converting a current flowing through each of the plurality of sensing lines into a sensing voltage representing a potential of each of the plurality of sensing lines, wherein:

each of the plurality of division sensing circuits includes a current load circuit for supplying a current to the one memory cell via a corresponding sensing line among the plurality of sensing lines, and a sense amplifier for sensing a potential difference between the potential of the corresponding sensing line and a potential of a corresponding reference line of a plurality of reference lines, and the current load circuit included in at least one division sensing circuit of the plurality of division sensing circuits has a current supply capability which is different from the current supply capability of the current load circuit included in another division sensing circuits among the plurality of division sensing circuits.

2. A reading circuit according to claim 1, wherein the current-voltage conversion circuit includes a cell current division section for connecting or separating the plurality of sensing lines to or from the one memory cell.

3. A reading circuit according to claim 1, further comprising a first reference circuit for applying a first type of reference voltage representing a potential of one reference line among the plurality of reference lines to a sense amplifier corresponding to the one reference line among the plurality of sense amplifiers.

4. A reading circuit according to claim 1, wherein the current supply capability of each of the plurality of current load circuits is controlled by a first type of reference voltage representing a potential of a reference line corresponding thereto among the plurality of reference lines.

5. A reading circuit according to claim 1, wherein each of the plurality of current load circuits includes a PMOS transistor having a gate to which a reference voltage is to be applied via a reference line corresponding thereto among the plurality of reference lines.

6. A reading circuit according to claim 1, further comprising a second reference circuit for applying a second type of reference voltage for controlling the current supply capability of each of the plurality of current load circuits.

7. A reading circuit according to claim 6, wherein each of the plurality of current load circuits includes a PMOS transistor having a gate connected to the second reference circuit.

8. A reading circuit according to claim 1, further comprising:
a first reference circuit for applying a first type of reference voltage representing a potential of one reference line among the plurality of reference lines to a sense amplifier corresponding to the one reference line among the plurality of sense amplifiers; and
a second reference circuit for applying a second type of reference voltage for controlling the current supply capability of each of the plurality of current load circuits,
wherein the first reference circuit is electrically connected to the second reference circuit.

9. A reading circuit according to claim 2, wherein:
the cell current division section includes a plurality of NMOS transistors, and
each of the plurality of NMOS transistors includes a gate and a source connected to the gate.

10. A reading circuit according to claim 9, wherein:
each of the plurality of NMOS transistors is connected to a current load circuit corresponding thereto among the plurality of current load circuits, and
the current supply capability of each of the plurality of NMOS transistors is different in accordance with the current supply capability of the current load circuit connected to the corresponding NMOS transistor.

11. A reading circuit according to claim 10, wherein as the current supply capability of each of the plurality of NMOS transistors is higher, the current supply capability of the current load circuit connected thereto is lower; and as the current supply capability of each of the plurality of NMOS transistors is lower, the current supply capability of the current load circuit connected thereto is higher.

12. A reading circuit according to claim 1, wherein the plurality of division sensing circuits operate in parallel.

13. A reading circuit according to claim 1, wherein each of the plurality of memory cells is a multi-level memory cell.

14. A reading circuit according to claim 3,
wherein the first reference circuit includes a plurality of reference voltage setting circuits, each of which includes:
a plurality of current load circuits each connected to a reference element via one sub reference line corresponding thereto among a plurality of sub reference lines, and
a current-voltage conversion circuit for converting a current flowing through one sub reference line among the plurality of sub reference lines into a reference voltage representing a potential of the one sub reference line, and
wherein the reference voltage which is output from one reference voltage setting circuit among the plurality of reference voltage setting circuits controls the current supply capability of at least one of the plurality of current load circuits included in another reference voltage setting circuit among the plurality of reference voltage setting circuits.

15. A reading circuit according to claim 8,
wherein the second reference circuit includes a plurality of reference voltage setting circuits, each of which includes:
a plurality of current load circuits each connected to a reference element via one sub reference line corresponding thereto among a plurality of sub reference lines, and
a current-voltage conversion circuit for converting a current flowing through one sub reference line among the plurality of sub reference lines into a reference voltage representing a potential of the one sub reference line, and
wherein the reference voltage which is output from the first reference circuit controls the current supply capability of at least one of the plurality of current load circuits included in one reference voltage setting circuit among the plurality of reference voltage setting circuits.

16. A reference circuit for generating a reference voltage for reading data from one memory cell among a plurality of memory cells, the reference circuit comprising:
a plurality of reference voltage setting circuits, each of which includes:
a plurality of current load circuits each connected to a reference element via one sub reference line corresponding thereto among a plurality of sub reference lines, and
a current-voltage conversion circuit for converting a current flowing through one sub reference line among the plurality of sub reference lines into a reference voltage representing a potential of the one sub reference line,
wherein the reference voltage which is output from one reference voltage setting circuit among the plurality of reference voltage setting circuits controls the current supply capability of at least one of the plurality of current load circuits included in another reference voltage setting circuit among the plurality of reference voltage setting circuits.

17. A reference circuit according to claim 16, wherein each of the plurality of current-voltage conversion circuits includes a reference current division section for connecting or separating the plurality of sub reference lines to or from the reference element.

18. A reference circuit according to claim 17, wherein:
each of the plurality of reference current division sections includes a plurality of NMOS transistors, and
each of the plurality of NMOS transistors includes a gate and a source connected to the gate.

19. A reference circuit according to claim 18, wherein:
each of the plurality of NMOS transistors is connected to a current load circuit corresponding thereto among the plurality of current load circuits, and
the current supply capability of each of the plurality of NMOS transistors is different in accordance with the current supply capability of the current load circuit connected to the corresponding NMOS transistor.

20. A reference circuit according to claim 19, wherein as the current supply capability of each of the plurality of NMOS transistors is higher, the current supply capability of the current load circuit connected thereto is lower; and as the current supply capability of each of the plurality of NMOS transistors is lower, the current supply capability of the current load circuit connected thereto is higher.

21. A reference circuit according to claim 16, wherein the reference element has substantially the same structure as that of each of the plurality of memory cells.

22. A reference circuit according to claim 16, wherein each of the plurality of current load circuits includes a PMOS transistor.

23. A reference circuit according to claim 22, wherein the PMOS transistor of one current load circuit among the plurality of current load circuits included in one reference voltage setting circuit among the plurality of reference voltage setting circuits is current-mirror-connected with a PMOS transistor of one current load circuit among the plurality of current load circuits included in another reference voltage setting circuit among the plurality of reference voltage setting circuits.

24. A reference circuit for generating a reference voltage for reading data from one memory cell among a plurality of memory cells, the reference circuit comprising:

a first reference circuit; and a second reference circuit, wherein the first reference circuit includes a plurality of reference voltage setting circuits, each of which includes:
- a plurality of current load circuits each connected to a reference element via one sub reference line corresponding thereto among a plurality of sub reference lines, and
- a current-voltage conversion circuit for converting a current flowing through one sub reference line among the plurality of sub reference lines into a reference voltage representing a potential of the one sub reference line, wherein the reference voltage which is output from one reference voltage setting circuit among the plurality of reference voltage setting circuits controls the current supply capability of at least one of the plurality of current load circuits included in another reference voltage setting circuit among the plurality of reference voltage setting circuits, wherein the second reference circuit includes a plurality of reference voltage setting circuits, each of which includes:
- a plurality of current load circuits each connected to a reference element via one sub reference line corresponding thereto among a plurality of sub reference lines, and
- a current-voltage conversion circuit for converting a current flowing through one sub reference line among the plurality of sub reference lines into a reference voltage representing a potential of the one sub reference line, and wherein the reference voltage which is output from the first reference circuit controls the current supply capability of at least one of the plurality of current load circuits included in a reference voltage setting circuit among the plurality of reference voltage setting circuits of the second reference current.

25. A semiconductor memory device, comprising:

a memory cell array including a plurality of memory cells; and a reading circuit for reading data from one memory cell among the plurality of memory cells, wherein the reading circuit includes:
- a plurality of division sensing circuits each connected to the one memory cell via a sensing line corresponding thereto among a plurality of sensing lines; and
- a current-voltage conversion circuit for converting a current flowing through each of the plurality of sensing lines into a sensing voltage representing a potential of each of the plurality of sensing lines, wherein each of the plurality of division sensing circuits includes a current load circuit for supplying a current to the one memory cell via a corresponding sensing line among the plurality of sensing lines, and a sense amplifier for sensing a potential difference between the potential of the corresponding sensing line and a potential of a reference line corresponding thereto among a plurality of reference lines, and wherein the current load circuit included in at least one division sensing circuit among the plurality of division sensing circuits has a current supply capability which is different from the current supply capability of the current load circuit included in another division sensing circuits among the plurality of division sensing circuits.

26. A semiconductor memory device according to claim 25, wherein each of the plurality of memory cells is a multi-level memory cell.

27. A semiconductor memory device, comprising:

a memory cell array including a plurality of memory cells; and a reference circuit for generating a reference voltage for reading data from one memory cell among the plurality of memory cells, wherein the reference circuit includes a plurality of reference voltage setting circuits, each of which includes:
- a plurality of current load circuits each connected to a reference element via one sub reference line corresponding thereto among a plurality of sub reference lines, and
- a current-voltage conversion circuit for converting a current flowing through one sub reference line among the plurality of sub reference lines into a reference voltage representing a potential of the one sub reference line, and wherein the reference voltage which is output from one reference voltage setting circuit among the plurality of reference voltage setting circuits controls the current supply capability of at least one of the plurality of current load circuits included in another reference voltage setting circuit among the plurality of reference voltage setting circuits.

* * * * *